(12) United States Patent
Barrett et al.

(10) Patent No.: US 9,797,960 B2
(45) Date of Patent: Oct. 24, 2017

(54) MANAGEMENT OF BATTERY CHARGING THROUGH COULOMB COUNTING

(75) Inventors: Stephen Barrett, Thatcham (GB); Peter William Dale Bishop, Purton (GB); Graham Ronald Johnson, Marlborough (GB)

(73) Assignee: PowerOasis Limited (GB)

( * ) Notice: Subject to any disclaimer, the term of this patent is extended or adjusted under 35 U.S.C. 154(b) by 800 days.

(21) Appl. No.: 13/572,578

(22) Filed: Aug. 10, 2012

(65) Prior Publication Data

US 2013/0038292 A1 Feb. 14, 2013

Related U.S. Application Data

(63) Continuation of application No. PCT/GB2011/000187, filed on Feb. 11, 2011.

(30) Foreign Application Priority Data

Feb. 12, 2010 (GB) .................................. 1002449.5
Mar. 3, 2010 (GB) .................................. 1003507.9

(51) Int. Cl.
*G01R 31/36* (2006.01)
*H02J 7/00* (2006.01)

(52) U.S. Cl.
CPC ..... *G01R 31/3651* (2013.01); *G01R 31/3617* (2013.01); *G01R 31/362* (2013.01); *G01R 31/3624* (2013.01); *G01R 31/3648* (2013.01); *G01R 31/3679* (2013.01); *H02J 2007/005* (2013.01)

(58) Field of Classification Search
CPC .............................. H02J 7/0078; G01R 31/361
USPC .......................................... 320/149, 132, 134
See application file for complete search history.

(56) References Cited

U.S. PATENT DOCUMENTS

| | | | | |
|---|---|---|---|---|
| 5,539,318 | A * | 7/1996 | Sasaki .............. | G01R 19/16542 324/427 |
| 5,945,829 | A * | 8/1999 | Bertness ............ | G01R 31/3662 320/150 |
| 6,300,763 | B1 * | 10/2001 | Kwok ................ | G01R 31/3651 320/132 |
| 6,356,083 | B1 * | 3/2002 | Ying ............................ | 324/426 |
| 6,453,249 | B1 * | 9/2002 | Shibutani et al. .............. | 702/63 |

(Continued)

*Primary Examiner* — Samuel Berhanu
*Assistant Examiner* — Tarikh Rankine
(74) *Attorney, Agent, or Firm* — Weide & Miller, Ltd.

(57) ABSTRACT

A battery charge management method and device operable to perform that method. The battery charge management method comprises the steps of determining charge delivered to or from a battery based on Coulomb counting and updating an estimated battery state of charge based on the amount of delivered charge and measuring the battery current. Then comparing the updated estimated battery state of charge with a predetermined state of charge value of less than 100%, such that each predetermined state of charge value being associated with an expected battery current for that predetermined state of charge value. The method also includes modifying the updated estimated battery state of charge when the updated estimated state of charge is greater than the predetermined state of charge value and the measured battery current is greater than the expected battery current associated with the predetermined state of charge.

15 Claims, 15 Drawing Sheets

(56) References Cited

U.S. PATENT DOCUMENTS

| | | | |
|---|---|---|---|
| 6,621,250 B1* | 9/2003 | Ohkubo | G01R 31/3613 |
| | | | 320/136 |
| 2002/0003417 A1* | 1/2002 | Bito et al. | 320/152 |
| 2002/0030494 A1* | 3/2002 | Araki et al. | 324/427 |
| 2003/0008202 A1* | 1/2003 | Tran | G01R 31/361 |
| | | | 429/61 |
| 2004/0162683 A1* | 8/2004 | Verbrugge et al. | 702/64 |
| 2005/0269991 A1* | 12/2005 | Mitsui | G01R 31/3624 |
| | | | 320/132 |
| 2006/0176024 A1* | 8/2006 | Zettel | H02J 7/0057 |
| | | | 320/132 |
| 2007/0114972 A1* | 5/2007 | Koo | G01R 31/3679 |
| | | | 320/132 |
| 2007/0216356 A1* | 9/2007 | Kamatani | 320/128 |
| 2008/0048616 A1* | 2/2008 | Paul | G01R 31/3624 |
| | | | 320/132 |
| 2008/0233469 A1 | 9/2008 | Drozdz et al. | |
| 2009/0132186 A1 | 5/2009 | Esnard et al. | |
| 2009/0146616 A1* | 6/2009 | Breton et al. | 322/37 |
| 2009/0182517 A1 | 7/2009 | Gandhi et al. | |
| 2010/0225325 A1* | 9/2010 | Christensen | G01R 31/3624 |
| | | | 324/426 |
| 2012/0126820 A1* | 5/2012 | Tan | H02J 7/0013 |
| | | | 324/434 |
| 2013/0204560 A1* | 8/2013 | Lo | G01R 31/361 |
| | | | 702/63 |

\* cited by examiner

MANAGEMENT OF BATTERY CHARGING THROUGH COULOMB COUNTING

PRIORITY CLAIM

This application is a continuation of and claims priority to and the benefit of PCT Application No. PCT/GB2011/000187 filed on Feb. 11, 2011 which claims priority to and the benefit of Great Britain Application No. 1003507.9 filed on Mar. 3, 2010 and Great Britain Application No. 1002449.5 filed on Feb. 12, 2010.

FIELD OF THE INVENTION

The present invention relates to methods for managing the charging of batteries through the use of Coulomb counting. The present invention is applicable to, but not limited to, the charging of lead acid gel batteries for powering mobile radio base stations.

BACKGROUND OF THE INVENTION

In order to charge a battery as rapidly as possible whilst simultaneously ensuring that the lifetime of the battery is prolonged, correct charging comprises a number of phases. During the bulk charging phase the charger is usually operating at its current limit and the voltage across the battery terminals increases as the battery is charged. At the end of the bulk charging phase the battery will hold a high proportionate charge, for example 80% of the maximum. When the bulk charging phase is completed the absorption charging phase begins, during this phase voltage is held constant at a comparatively high level which is achieved through regulation of the current. The transition between bulk charging and absorption charging can be determined by measuring the variation in the battery voltage. Overly prolonged absorption phase charging can be damaging to the battery, hence before damage can occur and typically before the battery is fully charged it is necessary to move to the float phase. During the float phase the voltage is reduced to a level where damage to the battery cannot occur, irrespective of how long the float phase lasts. Regulation of the current in both absorption and float phases also ensures that the battery does not overheat, thereby preventing any unwanted consequences for the longevity of the battery. At the end of a sufficiently long float phase the battery should be fully charged.

It is preferable for some battery types to continue charging until the battery is fully charged, so that the battery lifetime is prolonged. In the mobile radio base site power supply application it is desirable to identify the point at which the battery is fully charged, so that the generator can be switched off at the earliest opportunity in order to conserve fuel. Accurate determination of battery state of charge can enable the charging cycle to be completed in the absorption charging phase so that it is not necessary to go into a float phase. The state of charge value can also be used to trigger the activation of the generator to prevent the battery from being discharged too much, with the possible adverse consequences for battery longevity which would otherwise occur.

The state of charge of a battery can be determined by making measurements of battery voltage, however, this approach can be problematic for a number of reasons. One problem is that in some charging phases such as absorption there is little variation in voltage over a wide range of state of charge, which can lead to inaccurate estimation of state of charge. This can be problematic in situations, where it is necessary to configure the system to operate within a state of charge range for which the change in battery voltage is marginal, which might be the case for example when needing to prolong battery life. Another problem with voltage measurement based state of charge estimation is that battery voltage will be affected by battery temperature and the magnitude of the current which is being drawn, both of which would need to be compensated for.

An alternative method for determining battery state of charge is to monitor the charge that is flowing into and out of the battery in order to determine the state of charge of the battery at any particular moment, this method is called Coulomb counting. Using this technique it is possible to maintain an accurate estimate for the state of charge over all charging phases. The Coulomb counting approach also has a number of problems. One problem is that a method is needed for initializing the value to be used in the Coulomb count when the current state of charge of the battery is unknown, for example when a new battery is first connected to the charge management system. Another problem is that the Coulomb count may drift from the true value over time due, for example to measurement inaccuracy or internal discharge of the battery. A final problem is that the Coulomb count will give an inaccurate value for the percentage state of charge of the battery if the capacity of the battery has changed for any reason.

In a further aspect, in order to charge a battery as rapidly as possible whilst simultaneously ensuring that the lifetime of the battery is prolonged, correct charging comprises a number of phases. During the bulk charging phase the charger is usually operating at its current limit and the voltage across the battery terminals increases as the battery is charged. At the end of the bulk charging phase the battery will hold a high proportionate charge, for example 80% of the maximum. When the bulk charging phase is completed the absorption charging phase begins, during this phase voltage is held constant at a comparatively high level. The transition between bulk charging and absorption charging can be triggered when the measured battery voltage during bulk charging reaches a pre-determined threshold level. Overly prolonged absorption phase charging can be damaging to the battery, hence before damage can occur and typically before the battery is fully charged it is necessary to move to the float phase. During the float phase the voltage is reduced to a level where damage to the battery cannot occur, irrespective of how long the float phase lasts. Regulation of the current in the float phase may also be used to ensure that the battery does not overheat, thereby preventing any unwanted consequences for the longevity of the battery. At the end of a sufficiently long float phase the battery should be fully charged.

It is preferable for some battery types to continue charging until the battery is fully charged, so that the battery lifetime is prolonged. In the case of a diesel generator/battery hybrid power supply it is desirable to identify the point at which the battery approaches or reaches full charge, so that the generator can be switched off at the earliest opportunity in order to conserve fuel. Accurate determination of battery state of charge can enable the charging cycle to be completed in the absorption charging phase so that it is not necessary to go into a float phase. The state of charge value can also be used to trigger the activation of the generator to prevent the battery from being discharged too much, with the possible adverse consequences for battery longevity which would otherwise occur.

The state of charge of a battery can be determined by making measurements of battery voltage, however, this approach can be problematic for a number of reasons. One problem is that in some charging phases such as absorption the voltage level is regulated to a fixed level so that it cannot be used to determine state of charge. This can be problematic in situations where the system operates within a state of charge range corresponding to the absorption phase, for example when needing to prolong battery life or when availability of power from unreliable sources such as renewables is good. Another problem with voltage measurement based state of charge estimation is that battery voltage will be affected by battery temperature which would need to be compensated for.

An alternative method for determining battery state of charge is to monitor the charge that is flowing into and out of the battery in order to determine the state of charge of the battery at any particular moment; this method is called Coulomb counting. Using this technique it is possible to maintain an accurate estimate for the state of charge over all charging phases. The Coulomb counting approach also has a number of problems. One problem is that a method is needed for initialising the value to be used in the Coulomb count when the current state of charge of the battery is unknown, for example when a new battery is first connected to the charge management system. Another problem is that the Coulomb count may drift from the true value over time due, for example to measurement inaccuracy or internal discharge of the battery. A final problem is that the Coulomb count will give an inaccurate value for the percentage state of charge of the battery if the capacity of the battery has changed for any reason.

SUMMARY OF THE INVENTION

The present invention addresses some or all of the above problems that are encountered with Coulomb counting.

In a first aspect the present invention therefore provides a battery charge management method comprising the steps of determining charge delivered to or from a battery based on Coulomb counting and updating an estimated battery state of charge based on the amount of delivered charge; measuring the battery current; comparing the updated estimated battery state of charge with a predetermined state of charge value of less than 100%, each predetermined state of charge value being associated with an expected battery current for that predetermined state of charge value; and modifying the updated estimated battery state of charge when the updated estimated state of charge is greater than the predetermined state of charge value and the measured battery current is greater than the expected battery current associated with the predetermined state of charge.

Preferably, the battery charge management method further comprises the step of modifying the updated estimated state of charge to 100% when the measured battery current is less than a predetermined current value associated with the battery being fully charged.

Ideally, the predetermined state of charge value is determined at or near a point of greater than average change in the differential of battery state of charge expressed as a function of battery charging current. Also, when the battery's initial state of charge is unknown, an initial arbitrary value for the estimated battery state of charge is selected prior to the first update of the estimated state of charge.

In a specific embodiment, the step of modifying the updated estimated state of charge comprises the step of assigning the predetermined state of charge value to the updated estimated state of charge. Furthermore, charging of the battery may continue after the measured battery current equals or is less than the expected battery current associated with the predetermined state of charge value.

In a particular embodiment, the updated estimated state of charge is compared against a plurality of predetermined state of charge values, each predetermined state of charge value having an associated expect battery current, the updated estimated state of charge being modified when the updated estimated state of charge falls between two predetermined state of charge values but at least one of the two expected battery current values either side of the measured battery current is not associated with one of the two predetermined state of charge values either side of the updated estimated battery state of charge.

In a further aspect the present invention provides a battery management method comprising the steps of: determining charge delivered to or from a battery using Coulomb counting based upon an expected battery capacity; monitoring at least one characteristic of the battery representative of the battery's actual capacity; and modifying the expected battery capacity used in determining the charge delivered to or from the battery with respect to the monitored characteristic.

The monitored characteristic may be the number of charging cycles to which the battery has been subjected; the battery age; the integral of depth of discharge measured over all charge cycles since manufacture of the battery; the ambient temperature; and/or the difference between the battery temperature and the ambient temperature.

In a preferred embodiment the characteristic of the battery representative of the battery's actual capacity is monitored at a predetermined point in the charging/discharging cycle of the battery and the method further comprises the steps of: comparing the monitored characteristic with an expected value based on the expected battery capacity; and modifying the expected battery capacity when the comparison identifies a difference between the monitored characteristic and the expected value. When the comparison indicates the actual battery capacity to be lower than the expected battery capacity, the expected battery capacity may be reduced a small amount each charge cycle until substantially no difference is identified in the comparison step and when the comparison indicates the actual battery capacity to be higher than the expected battery capacity, the expected battery capacity may be increased by a small amount each charge cycle until substantially no difference is identified in the comparison step.

The monitored battery characteristic may be the voltage level of the battery at the end of a discharge period or the monitored battery characteristic may be the battery charging current at a selected state of charge. In the latter case, the curve of battery charging current with respect to battery state of charge may be compared with a set of pre-determined mappings.

In a further preferred embodiment, the battery may comprise a string of battery cells and the expected battery capacity may be modified when it is determined that one or more battery cells have ceased to function. In this embodiment the method may further comprise the step of comparing the voltage measured across half the cells in the battery string with the voltage measured across the other half of the battery cells in the battery string and determining whether one or more battery cells have ceased to function on the basis of a difference between the measured voltages. This enables the number of failed battery cells to be estimated according to the magnitude of the difference between the two measured voltages and when it is determined a modification of the expected battery capacity is required, the expected battery capacity may be modified by an amount determined with respect to a look-up table of battery capacity versus number of failed cells.

It will, of course, be apparent that the battery management method described above may be combined with the battery charge management method also described above in which case the predetermined state of charge value may be changed when the expected battery capacity is modified.

In a further aspect the present invention provides a battery charge management device comprising: means for measuring the battery current; a Coulomb counter for determining charge delivered to or from a battery based on Coulomb counting and for updating an estimated battery state of charge based on the amount of delivered charge; memory means in which is stored a predetermined state of charge value of less than 100% and an expected battery current for that predetermined state of charge; an analyser for comparing the updated estimated battery state of charge with the predetermined state of charge value and for modifying the updated estimated battery state of charge when the updated estimated state of charge is greater than the predetermined state of charge value and the measured battery current is greater than the expected battery current associated with the predetermined state of charge.

In a still further aspect the present invention provides a battery management device comprising: a Coulomb counter for determining charge delivered to or from a battery using Coulomb counting based upon an expected battery capacity; a controller for monitoring at least one characteristic of the battery representative of the battery's actual capacity; and for modifying the expected battery capacity used in determining the charge delivered to or from the battery with respect to the monitored characteristic.

The battery management device may further comprise a temperature monitor for monitoring one or both of ambient temperature and battery temperature.

Alternatively, the controller may be adapted to monitor the at least one characteristic of the battery at a predetermined point in the charging/discharging cycle of the battery and may be adapted to compare the monitored characteristic with an expected value based on the expected battery capacity so as to modify the expected battery capacity when the comparison identifies a difference between the monitored characteristic and the expected value.

Thus, according to the present invention a battery charge management method and apparatus based on Coulomb counting are provided which correct for any divergence between an estimated state of charge and an actual state of charge, by modifying the estimated battery state of charge value on the occasions when the measured battery charging current is inconsistent with the expected battery charging current for the given estimated state of charge. Also according to the present invention a battery management method and apparatus are provided which enable the expected maximum battery capacity used in Coulomb counting to be adjusted either alone or in combination with adjustment of the expected state of charge.

Also disclosed herein are additional solutions that overcome the problems in the prior art that are encountered with Coulomb counting.

In another aspect the present invention therefore provides a battery charge management method comprising the steps of: determining charge delivered to or from a battery based on Coulomb counting and updating an estimated battery state of charge based on the amount of delivered charge; measuring the battery current; comparing the updated estimated battery state of charge with a predetermined state of charge value of less than 100%, each predetermined state of charge value being associated with an expected battery current for that predetermined state of charge value; and modifying the updated estimated battery state of charge either: i) when the updated estimated state of charge is greater than the predetermined state of charge value or equal to the predetermined state of charge and the measured battery current is greater than the expected battery current associated with the predetermined state of charge or equal to the expected battery current associated with the predetermined state of charge, or ii) when the estimated state of charge is not equal to the pre-determined state of charge but the measured battery current is substantially equal to the expected battery current associated with the predetermined state of charge.

Preferably, the battery charge management method further comprises the step of modifying the updated estimated state of charge to an end point state of charge value when the measured battery current is at least less than a predetermined current value at which further charging of the battery is halted. In a preferred embodiment the end point state of charge value is around 97%.

When the battery's initial state of charge is unknown, an initial arbitrary value for the estimated battery state of charge may be selected prior to the first update of the estimated state of charge.

In a specific embodiment, the step of modifying the updated estimated state of charge comprises the step of assigning the predetermined state of charge value to the updated estimated state of charge. Furthermore, charging of the battery may continue after the measured battery current equals or is less than the expected battery current associated with the predetermined state of charge value.

In a particular embodiment, the updated estimated state of charge is compared against a plurality of predetermined state of charge values, each predetermined state of charge value having an associated expect battery current, the updated estimated state of charge being modified when the updated estimated state of charge falls between two predetermined state of charge values but at least one of the two expected battery current values either side of the measured battery current is not associated with one of the two predetermined state of charge values either side of the updated estimated battery state of charge.

Moreover, preferably the estimated battery state of charge is only modified during a charging phase in which battery voltage is regulated to the absorption voltage, more preferably during a battery charging phase when the available current to charge the battery is greater than the current which can be drawn by the battery. When the battery is charged at least in part using current supplied by a wind turbine, the available current may be determined with respect to a measurement of wind speed and/or when the battery is charge at least in part using current supplied by a photovoltaic panel, the available current may be determined with respect to a measurement of solar insolation.

In a further aspect the present invention provides a battery management method comprising the steps of: determining charge delivered to or from a battery using Coulomb counting wherein the maximum amount of charge that can be delivered to or from the battery is based upon an expected battery capacity; monitoring at least one characteristic of the battery representative of the battery's actual capacity; and modifying the expected battery capacity in accordance with the monitored characteristic.

The monitored characteristic may be the number of charging cycles to which the battery has been subjected; the battery age; the integral of depth of discharge measured over all charge cycles since manufacture of the battery; the ambient temperature; and/or the difference between the battery temperature and the ambient temperature.

In a preferred embodiment the characteristic of the battery representative of the battery's actual capacity is monitored at a predetermined point in the charging/discharging cycle of the battery and the method further comprises the steps of: comparing the monitored characteristic with an expected value based on the expected battery capacity; and modifying the expected battery capacity when the comparison identifies a difference between the monitored characteristic and the expected value. When the comparison indicates the actual battery capacity to be lower than the expected battery capacity, the expected battery capacity may be reduced a small amount each charge cycle until substantially no difference is identified in the comparison step and when the comparison indicates the actual battery capacity to be higher than the expected battery capacity, the expected battery capacity may be increased by a small amount each charge cycle until substantially no difference is identified in the comparison step.

The monitored battery characteristic may be the voltage level of the battery at the end of a discharge period or the monitored battery characteristic may be the battery charging current at a selected state of charge. In the latter case, the curve of battery charging current with respect to battery state of charge may be compared with a set of pre-determined mappings.

In a further preferred embodiment, the battery may comprise a string of battery cells and the expected battery capacity may be modified when it is determined that one or more battery cells have ceased to function. In this embodiment the method may further comprise the step of comparing the voltage measured across half the cells in the battery string with the voltage measured across the other half of the battery cells in the battery string and determining whether one or more battery cells have ceased to function on the basis of a difference between the measured voltages. This enables the number of failed battery cells to be estimated according to the magnitude of the difference between the two measured voltages and when it is determined a modification of the expected battery capacity is required, the expected battery capacity may be modified by an amount determined with respect to a look-up table of battery capacity versus number of failed cells.

It will, of course, be apparent that the battery management method described above may be combined with the battery charge management method also described above in which case the predetermined state of charge value may be changed when the expected battery capacity is modified.

In a further aspect the present invention provides a battery charge management device comprising: means for measuring the battery current; a Coulomb counter for determining charge delivered to or from a battery based on Coulomb counting and for updating an estimated battery state of charge based on the amount of delivered charge; memory means in which is stored a predetermined state of charge value of less than 100% and an expected battery current associated with the predetermined state of charge; an analyser for comparing the updated estimated battery state of charge with the predetermined state of charge value and for modifying the updated estimated battery state of charge either: i) when the updated estimated state of charge is greater than the predetermined state of charge value or equal to the predetermined state of charge value and the measured battery current is greater than the expected battery current associated with the predetermined state of charge or equal to the expected battery current associated with the predetermined state of charge, or ii) when the estimated state of charge is not equal to the pre-determined state of charge but the measured battery current is substantially equal to the expected battery current associated with the predetermined state of charge.

In a still further aspect the present invention provides a battery management device comprising: a Coulomb counter for determining charge delivered to or from a battery using Coulomb counting wherein the maximum amount of charge that can be delivered to or from the battery is based upon an expected battery capacity; a controller for monitoring at least one characteristic of the battery representative of the battery's actual capacity; and for modifying the expected battery capacity in accordance with the monitored characteristic.

The battery management device may further comprise a temperature monitor for monitoring one or both of ambient temperature and battery temperature.

Alternatively, the controller may be adapted to monitor the at least one characteristic of the battery at a predetermined point in the charging/discharging cycle of the battery and may be adapted to compare the monitored characteristic with an expected value based on the expected battery capacity so as to modify the expected battery capacity when the comparison identifies a difference between the monitored characteristic and the expected value.

Thus, according to the present invention a battery charge management method and apparatus based on Coulomb counting are provided which correct for any divergence between an estimated state of charge and an actual state of charge, by modifying the estimated battery state of charge value on the occasions when the measured battery charging current is inconsistent with the expected battery charging current for the given estimated state of charge. Also according to the present invention a battery management method and apparatus are provided which enable the expected maximum battery capacity used in Coulomb counting to be adjusted either alone or in combination with adjustment of the expected state of charge.

Further particular and preferred aspects of the present invention are set out in the accompanying independent and dependent claims. Features of the dependent claims may be combined with features of the independent claims as appropriate, and in combinations other than those explicitly set out in the claims.

BRIEF DESCRIPTION OF THE DRAWINGS

Embodiments of the present invention will now be described by way of example only with reference to the accompanying drawings, in which.

DETAILED DESCRIPTION OF THE DRAWINGS

Figure 1:
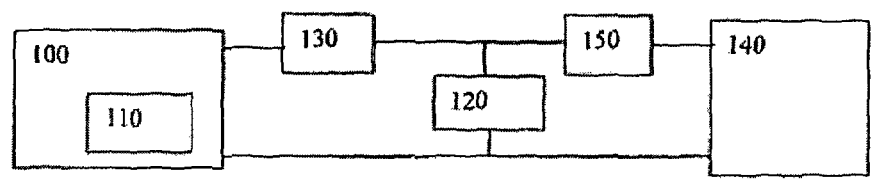
FIG. 1 shows a charging circuit system architecture in accordance with the present invention.

FIG. 1 shows the charging circuit system architecture. Charging equipment (100) supplies current to the battery (120) and load (140). The charging equipment (100) incorporates a battery charge management controller (110) which manages the charging of the battery (120) and provides the necessary current and voltage regulation. The charging equipment (100) may also include, for example a generator and if necessary a rectifier. An ammeter (130) monitors the current flowing from the battery charger (100) into the battery (120) and load (140). Another ammeter (150) monitors the current flowing into the load (140). By subtracting the current measured by ammeter (150) from the current measured by ammeter (130) the battery charge management controller (110) computes the amount of current flowing into or out of the battery (120). The battery charge management controller (110) can thereby keep track of the amount of charge stored in the battery, this process is known as Coulomb counting.

Figure 2:
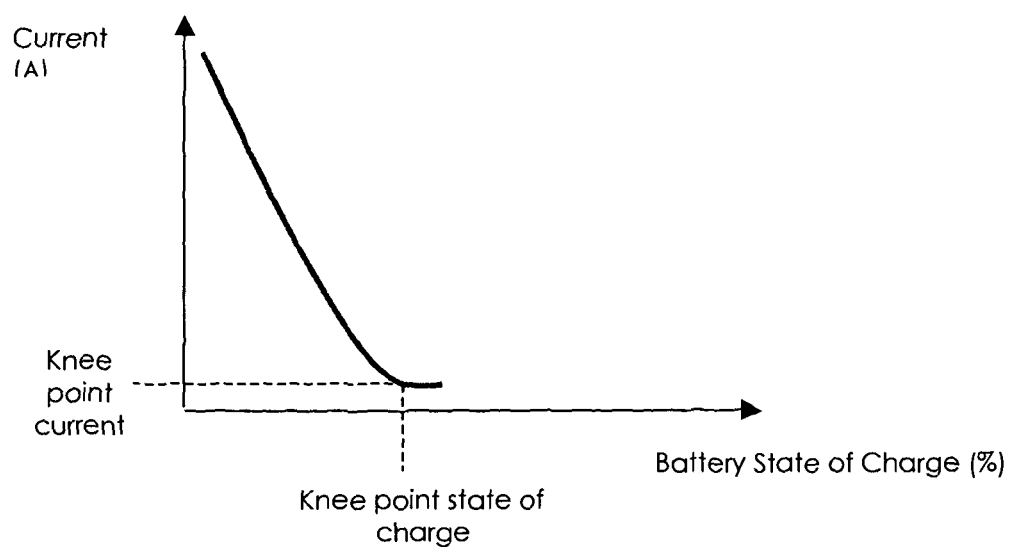
FIG. 2 shows a curve of the current drawn by the battery from the charger versus the state of charge of the battery.

FIG. 2 shows a curve of the current drawn by the battery from the charger versus the state of charge of the battery. It can be seen that there is a knee point in the curve which can be identified by the point at which there is a sharp change in the differential of the curve. Measurements can be made of the current flowing from the charger into the battery when the computed battery state of charge is in and around the knee point state of charge. If this measured current differs from that which would be expected then this indicates that the computed battery state of charge does not correspond to the actual state of charge and hence that a correction to the computed state of charge needs to be applied.

Figure 3:
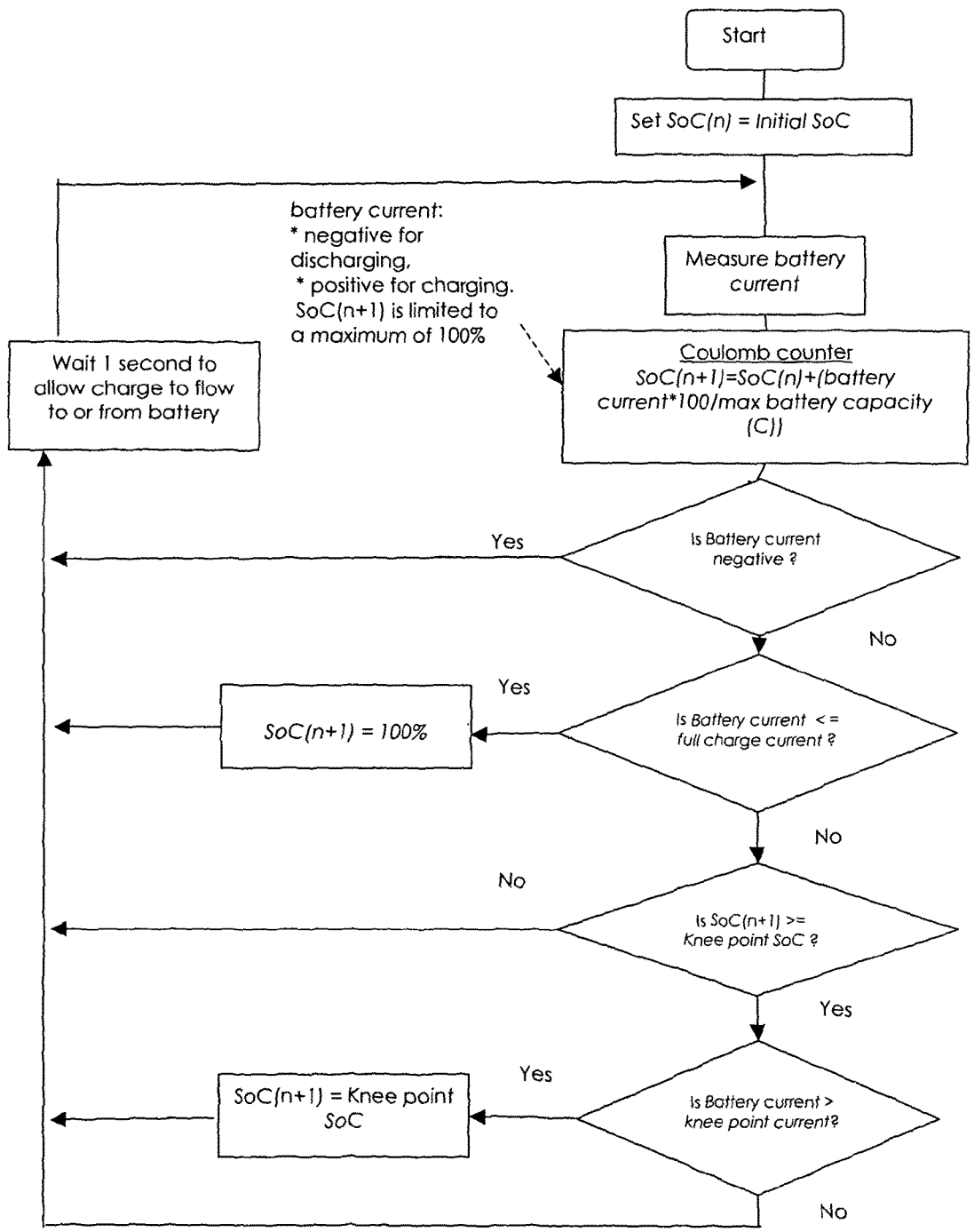
FIG. 3 shows a flow chart of a Coulomb counting based charge management algorithm in accordance with the present invention which includes the capability to correct for divergence between an estimated state of charge and an assumed actual state of charge.

FIG. 3 shows a flow chart illustrating an example of a Coulomb counting algorithm that includes features for correcting the value for the estimate of percentage state of charge. This algorithm solves three problems. Firstly it enables the state of charge to be tracked through Coulomb counting so that actions such as switching the generator on or off can be triggered based on the state of charge estimation. Secondly it solves the problem where the initial state of charge of the battery is unknown. It does this by training an arbitrarily estimated value of SoC to a correct value of SoC. Thirdly it solves the problem that the SoC estimated by the algorithm may drift from the actual state of charge, which may occur for example due to measurement inaccuracy or due to internal discharge of the battery. The algorithm solves this third problem by correcting the value estimated by the algorithm for SoC every time the battery approaches a knee point in the curve of battery state of charge vs charging current or when the battery reaches full charge.

When the system is initially commissioned or when a system reset is performed, such that current state of charge data is either unavailable or has been lost then the estimate for the percentage state of charge, 'SoC(n)' of the battery which is estimated by the algorithm is set to an arbitrary value 'Initial SoC', for example 90%. Then once every second the Coulomb count is updated to account for the charge that has flowed into or out of the battery during the one second period. In order to update the Coulomb count a measurement of the 'battery current' flowing into or out of the battery is made. If the current is flowing into the battery then 'battery current' takes a positive value, if the current is flowing out of the battery and the battery is discharging into the load then 'battery current' takes a negative value. Since 1 Ampere is equivalent to a charge flow of 1 Coulomb per second, the change in 'SoC' is given by 'battery current' multiplied by 100 divided by the maximum charge carrying capacity of the battery (measured in Coulombs). In addition, during each one second loop a number of checks are performed to see whether the assumed 'SoC' needs to be corrected. Any correction in the assumed 'SoC' value is performed by comparing the estimated SoC with one or more pre-selected expected SoC values. These corrections can be performed when measured charging currents reach one or more pre-selected current values: either when measured current matches the current at the knee point of the curve of battery state of charge versus battery current, see FIG. 2 or when current drops to the full charge current at which point the battery is estimated to be 100% charged. If the battery charging current drops to the 'full charge current' of for example 10 A then the estimate for state of charge can be corrected to 100%. If estimated 'SoC' is greater or equal than the 'knee point SoC' but measured battery charging current is higher than would be expected for this state of charge then estimated 'SoC' is temporarily capped at the 'knee point SoC' until the battery current comes into line with the expected current flow at the knee point. Knee point SoC might for example be 97% and knee point current might for example be 30 A, full charge current at 100% SoC might for example be 10 A or less. One of the benefits in identifying multiple distinctive points in the curve of battery charging current vs state of charge at which corrections in the estimated state of charge can be applied is that more flexibility is provided in the selection of the upper state of charge point which is used to trigger the switching off of the generator.

Figure 4:
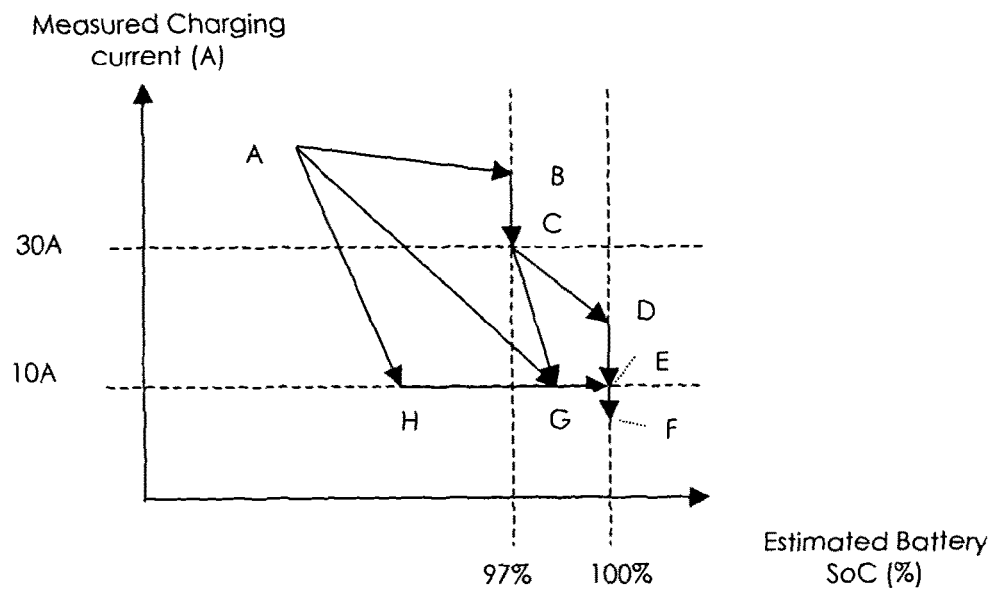
FIG. 4, FIG. 5 and FIG. 6 illustrate different trajectories that the estimate of state of charge may follow as the battery is charged, with each figure drawn for a different initial state.
Figure 5:
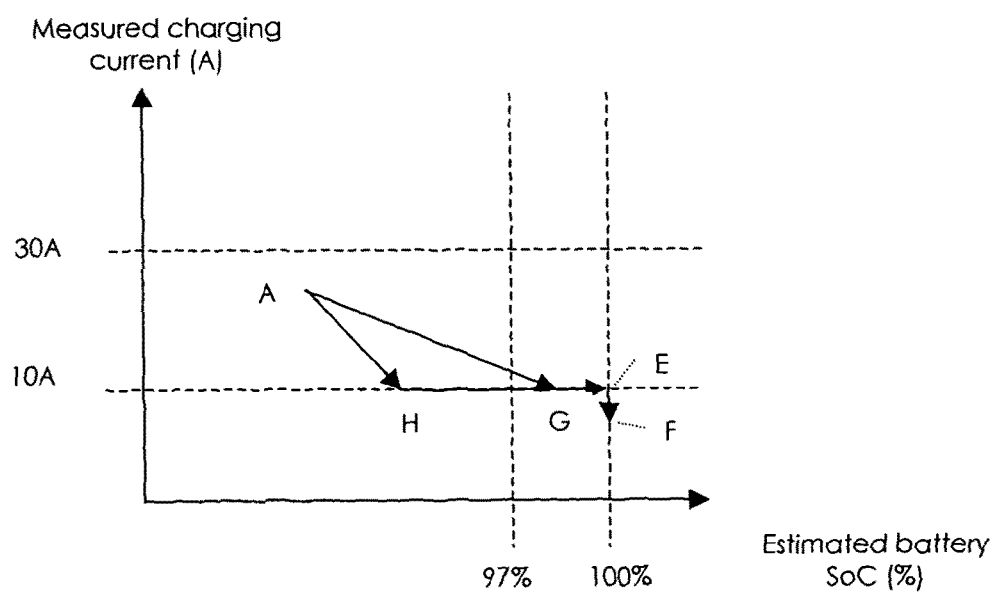
Figure 6:
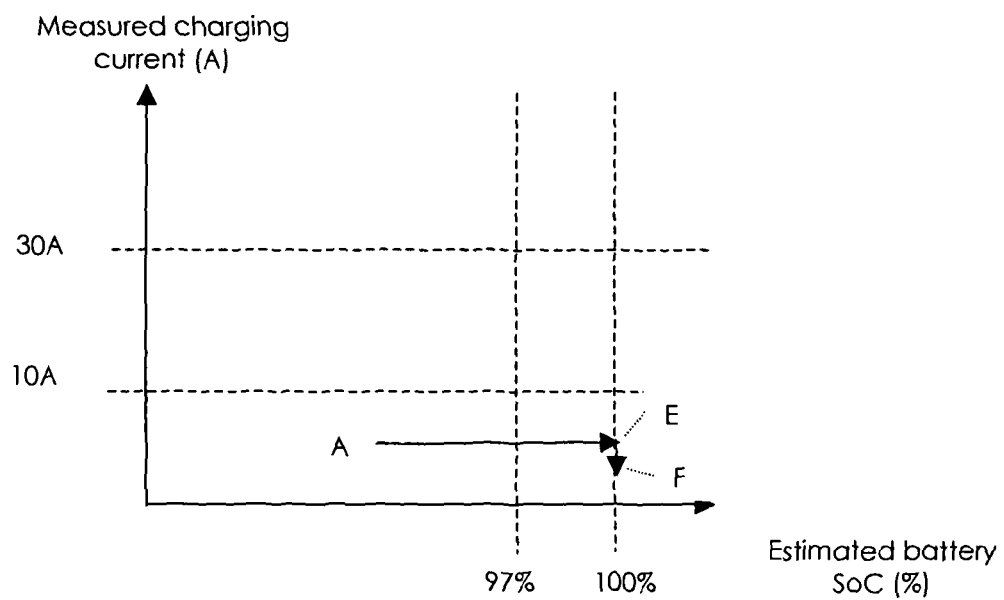

FIG. 4, FIG. 5 and FIG. 6 illustrate the different trajectories that the estimate of 'SoC' may take, with each figure drawn for a different initial state which is indicated by point A on all the plots. For each figure the algorithm may arrive at point A when the system is originally initialised, for example when the system is first commissioned. In the case of FIG. 4 the system might alternatively arrive at point A following a significant discharge. In the mobile radio base site power supply application a significant discharge would be expected to occur typically once per day, and state of charge might typically drop to 55% for example.

In FIG. 4 the current flowing at point A is greater than the 'knee point current' of 30 A and the estimated SoC is less than the knee point SoC of 97%. As Coulombs are counted the estimate for 'SoC' may move from A to B, A to G or A to H. If the estimated SoC moves from A to B then at point B the estimated SoC is held at 97% until measured charging current has reduced to the 'knee point current', which occurs at point C after which upward revised estimations of the SoC based on Coulomb counting can recommence. The estimate in SoC can then move from point C either to point D where the Coulomb count will cap it at 100% or can move to point G where, because the current has dropped to the 'full charge current', the estimated SoC is corrected to 100% which is indicated by a jump along the trajectory to point E. Once the estimated state of charge has reached either point D or E any further reductions in the charging current result in no change of the estimated SoC which is held at 100%. Alternatively, the computation of the estimated SoC may take the trajectory A to G or A to H, where in each case once the charging current has reduced to the 'full charge current' of 10 A, the estimate of SoC is corrected to a value of 100%, indicated by a jump along the trajectory to point E.

In FIG. 5 the measured current flowing at point A is less than the 'knee point current' of 30 A but greater than the 'full charge current' of 10 A, whilst the estimated SoC is less than the knee point SoC of 97%. As Coulombs are counted the estimate for 'SoC' may move from A to G or A to H, where in each case once the charging current has reduced to the 'full charge current' of 10 A, the estimate of SoC is corrected to a value of 100% shown by a jump along the trajectory to point E. If charging current continues to fall, the estimated state of charge is held at 100%, as shown by the part of the trajectory between points E and F.

In FIG. 6 the current flowing at point A is less than the 'full charge current' of 10 A, whilst the estimated SoC is less than the knee point SoC of 97%. As Coulombs are counted the estimate for 'SoC' will jump from point A to point E as the estimated state of charge is corrected to 100%.

It may be noted that when the system is initially commissioned the battery charge management algorithm will not gain an accurate value for battery state of charge until the battery is approaching full charge. This is acceptable in applications where, in the first charge cycle following commissioning the main purpose of the Coulomb counting algorithm will be to determine the point at which the battery reaches full charge so that the generator can be switched off. Note that the change in current and voltage regulation required as the charging moves from the bulk charging phase to the absorption charging phase can be triggered by alternative methods such as through monitoring of the battery voltage level.

An alternative way of correcting for the possible drift between computed Coulomb count and actual Coulomb count is to periodically perform an extended run in the float phase at the end of which there can be a high level of confidence that the battery will have reached full charge after which the assumed value for state of charge can be set accordingly at 100%. However, this is more costly in energy consumption terms since charging current needs to be supplied for longer than is necessary.

The capacity of a battery will decrease over time as it ages and/or as battery cells cease to be effective. However, the battery charging algorithm requires an accurate value for maximum battery capacity (measured in Ah). This is because if the algorithm uses a value for battery capacity which is higher than what it actually is then the depth of discharge will be more than is desirable, since the Coulomb counting algorithm will allow more charge to flow out of the battery than is desirable, which will reduce battery longevity. Hence there is a need to determine the changing capacity of the battery, 'max battery capacity' as it ages and to then apply the new value in the battery charge management algorithm (FIG. 3).

Figure 7:
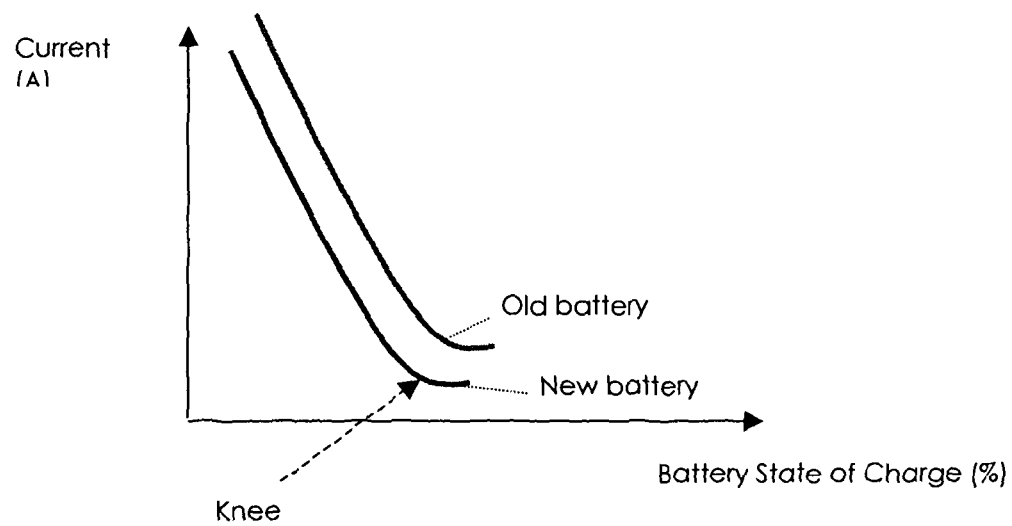
FIG. 7 shows the curve of battery current drawn versus battery state of charge for two different batteries, where each battery is of a different age.

FIG. 7 shows the curve of battery current drawn versus battery state of charge. For some battery types the shape of this curve will change as the battery ages or as some of the battery cells in a battery string fail. Hence in addition to modifying the value for maximum battery capacity as a battery ages or as cells fail, it may also be necessary to change other values used in the charge management algorithm of FIG. 3 such as the values of battery charging current and state of charge at the knee point and the value for battery charging current at full charge.

Figure 8:
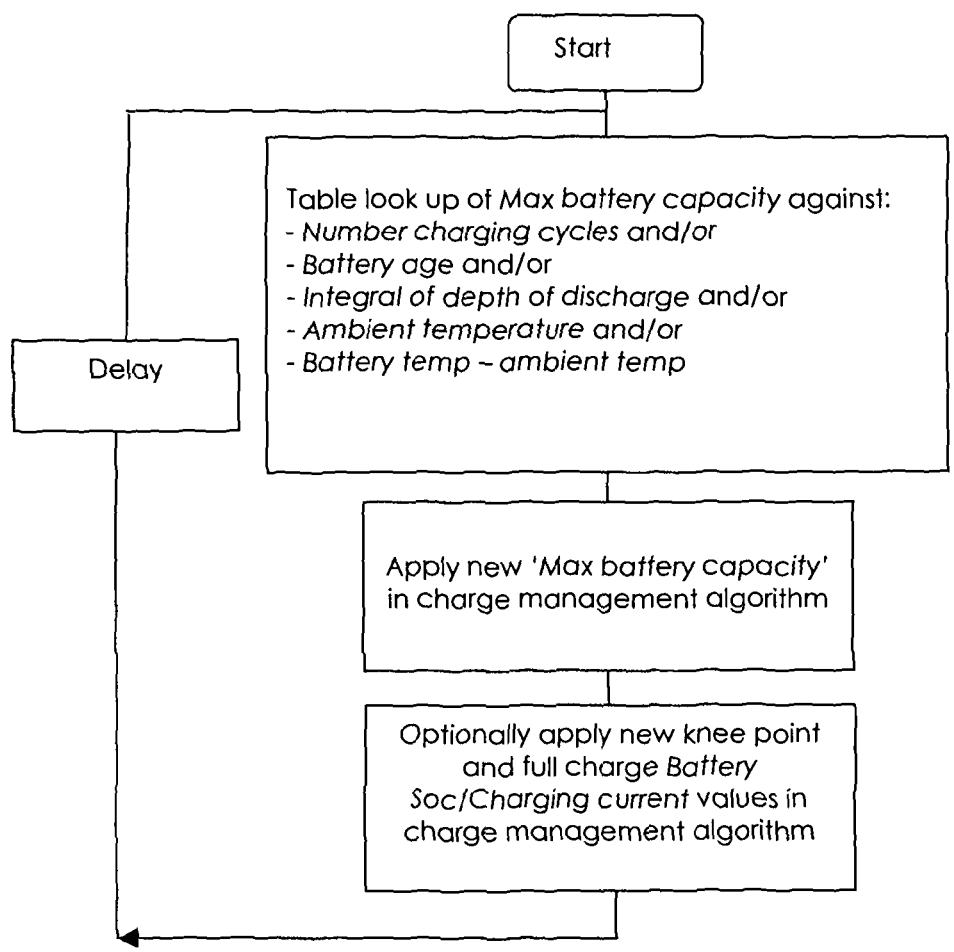
FIG. 8 illustrates a flow chart for tracking changes in battery capacity in accordance with a further aspect of the present invention and thence apply updates to certain of the values which are used in the charge management algorithm.

FIG. 8 shows an example of an algorithm which can be used to track changes in battery capacity and thence apply the corresponding updates to the pre-selected values used in the charge management algorithm. Depending on the type of battery, it may be appropriate to perform a table look up of maximum battery capacity against one or more values. One such value is the number of battery cycles since manufacture. Another such value is the actual age of the battery as measured in terms of the number of days expired since the battery was manufactured. Another value is the integral of the depth of discharge measured over all the charge cycles since manufacture, where depth of discharge is the proportionate discharge of the battery relative to the maximum possible discharge. Another value is the ambient temperature. Another value is the difference between ambient temperature and battery value. The algorithm could use any or all of these parameters to perform a look up against a pre-computed multi-dimensional table which would give a figure for the maximum battery capacity that should be assumed. Optionally, the table look up may also be used to provide values for knee point state of charge and charging current and/or current at full charge. Having made an update to the values used in the charge management algorithm a re-computation of values would not be undertaken again until after some period had expired. This period is indicated as 'delay' in FIG. 8. If the algorithm were making use of ambient temperatures readings then this re-evaluation might be frequent, for example hourly. Alternatively where it is the case that only other more slowly changing factors are taken into account, such as integral of depth of discharge then the delay may take on a larger value such as one week.

Figure 9:
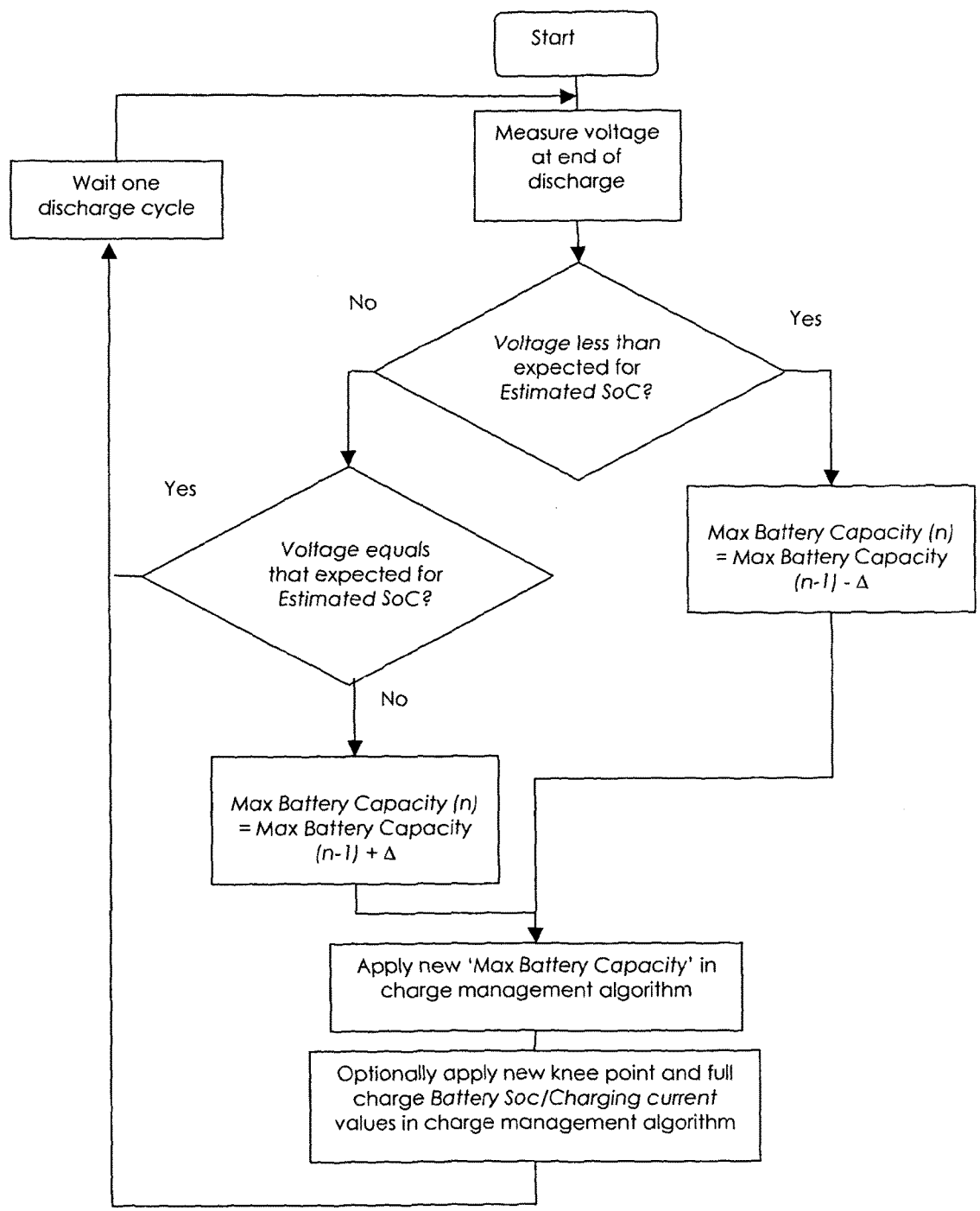
FIG. 9 illustrates another flow chart for identifying changes in battery capacity in accordance with the further aspect of the present invention and thence apply updates to certain of the values which are used in the charge management algorithm of FIG. 3.

FIG. 9 illustrates an alternative algorithm for identifying a difference between the battery capacity assumed by the battery charge management algorithm and the actual battery capacity by measuring the voltage level at the end of the discharge period and seeing whether it is lower or higher than that which would be expected given the computed Coulomb count. If the charge management algorithm uses a value for battery capacity which is higher than what it actually is then the depth of discharge will be more than is desirable, because the Coulomb counting algorithm will have allowed more charge to flow out of the battery than is desirable. In this case the battery voltage at the end of the discharge will therefore be lower than what would be expected for the given state of charge. In the converse situation, if the algorithm uses a value for battery capacity which is lower than what it actually is then the allowed depth of discharge will be limited to a lesser amount than that which would actually be acceptable. In this case the battery voltage at the end of the discharge will be higher than would be expected for the given state of charge. A correction for the case where the measured battery capacity appears to be lower than the assumed battery capacity can be achieved by decrementing the assumed value for maximum battery capacity by a small amount in each charge cycle until the voltage level at the end of the discharge period corresponds to that which would be expected for the computed Coulomb count. A correction for the case where the measured battery capacity appears to be higher than the assumed battery capacity can be achieved by incrementing the assumed value for maximum battery capacity by a small amount in each charge cycle until the voltage level at the end of the discharge period corresponds to that which would be expected for the computed Coulomb count. Optionally the derived value for current maximum battery capacity could also be used to perform a table look up of the values for knee point state of charge and knee point charging current and/or current at full charge. Re-evaluation of the charge management algorithm values would occur once every discharge cycle, which in the case of the mobile radio base station power supply application would typically be daily. Hence in this example the 'delay' referred to in the flow chart would be one day.

Figure 10:
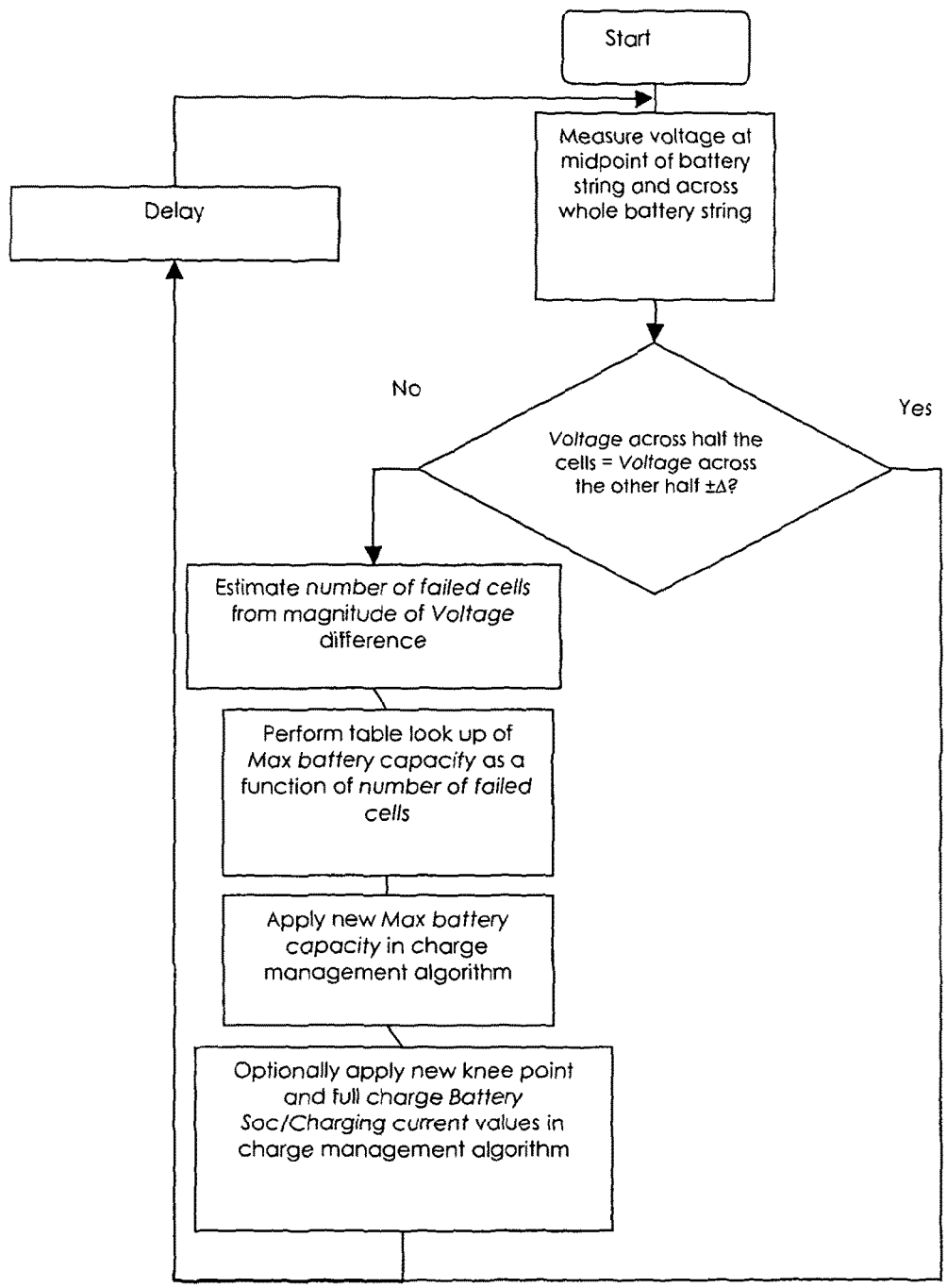
FIG. 10 illustrates a flow chart for identifying changes in battery capacity caused by battery cell failure in accordance with the further aspect of the present invention and thence apply the corresponding required updates to certain of the values which are used in the charge management algorithm of FIG. 3.

The curve of battery state of charge versus charging current will change in the event that a cell fails, since the string with the failed cell will become more resistive. FIG. 10 illustrates an alternative algorithm for triggering the application of new values in the battery charge management algorithm through the detection of catastrophic failure of one or more battery cells. Detection of battery cell failure can be performed by measuring voltage at the midpoint of the cells in a string of cells, such that the voltage across half the cells in a string can be compared with the voltage across the other half of cells in the string. If the two voltage measurements are not sufficiently close then this is indicative of a cell failure. The magnitude of the voltage difference can give an indication of the number of cells that have failed. It should be noted that failure is only detectable using this method when equivalent failures have not occurred on either side of the midpoint. Where a battery cell failure has occurred the values for maximum battery capacity, knee point state of charge, knee point current and/or charging current at full charge used in the charge management algorithm can be obtained by performing a table look up against the number of failed cells. Re-evaluation of the charge management algorithm values would occur fairly frequently, for example once every discharge cycle, which in the case of the mobile radio base station power supply application would typically be daily. Hence the 'delay' referred to in the flow chart would be one day.

Finally, another method for detecting changes in the values which should be applied in the charge management algorithm would be to monitor charging current following an extended run in the float phase, following which it would be known with a high degree of probability that the battery is fully charged. The charging current measurement could then be used to perform a table look up of the other values, for example knee point SoC and knee point charging current that are required by the Coulomb counting algorithm. Because there is a cost in terms of diesel consumption in charging the battery during the float phase, such a re-calibration of algorithmic values would be done relatively infrequently, for example typically less than once a week.

Changes to the apparatus and methods described in detail above are envisaged without departing from the scope of the invention as set out in the accompanying claims. In particular, in FIGS. 4, 5 and 6 although further charging of the battery between points E and F is illustrated, it is envisaged that the charging cycle may be stopped at point E and that charging along the trajectory E-F is only performed occasionally as an extended float phase charge.

Also disclosed herein are methods for managing the charging of batteries through the use of Coulomb counting. This is applicable to, but not limited to, the charging of lead acid gel batteries for powering mobile radio base stations.

Figure 11:
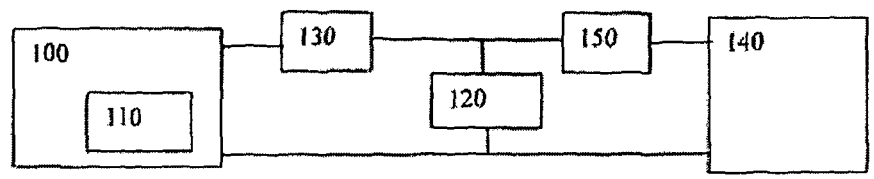
FIG. 11 shows a charging circuit system architecture in accordance with the present invention.

FIG. 11 shows the charging circuit system architecture. Charging equipment (100) supplies current to the battery (120) and load (140). The charging equipment (100) incorporates a battery charge management controller (110) which manages the charging of the battery (120) and provides the necessary current and voltage regulation. The charging equipment (100) may also include, for example a generator, wind turbine, solar panels or grid connection and if necessary a rectifier. An ammeter (130) monitors the current flowing from the battery charger (100) into the battery (120) and load (140). Another ammeter (150) monitors the current flowing into the load (140). By subtracting the current measured by ammeter (150) from the current measured by ammeter (130) the battery charge management controller (110) computes the amount of current flowing into or out of the battery (120). The battery charge management controller (110) can thereby keep track of the amount of charge stored in the battery, this process is known as Coulomb counting.

Figure 12:
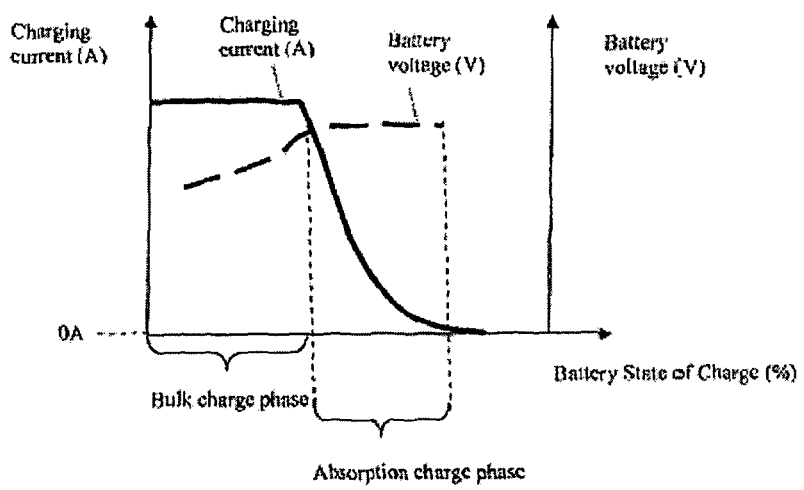
FIG. 12 shows a curve of the current drawn by the battery from the charger versus the state of charge of the battery.

FIG. 12 shows a curve of the current drawn by the battery from the charger versus the state of charge of the battery. It can be seen that during bulk charging current is constant and battery voltage is allowed to increase. During the absorption phase voltage is held constant and charging current is allowed to fall in proportion to the charge acceptance of the battery. Hence during the absorption phase it is possible to infer the state of charge of the battery from the magnitude of the charging current. If the measured charging current during the absorption phase differs from that which would be expected at a state of charge level equal to the estimated state of charge then this indicates that a correction to the estimated state of charge should be applied.

Figure 13:
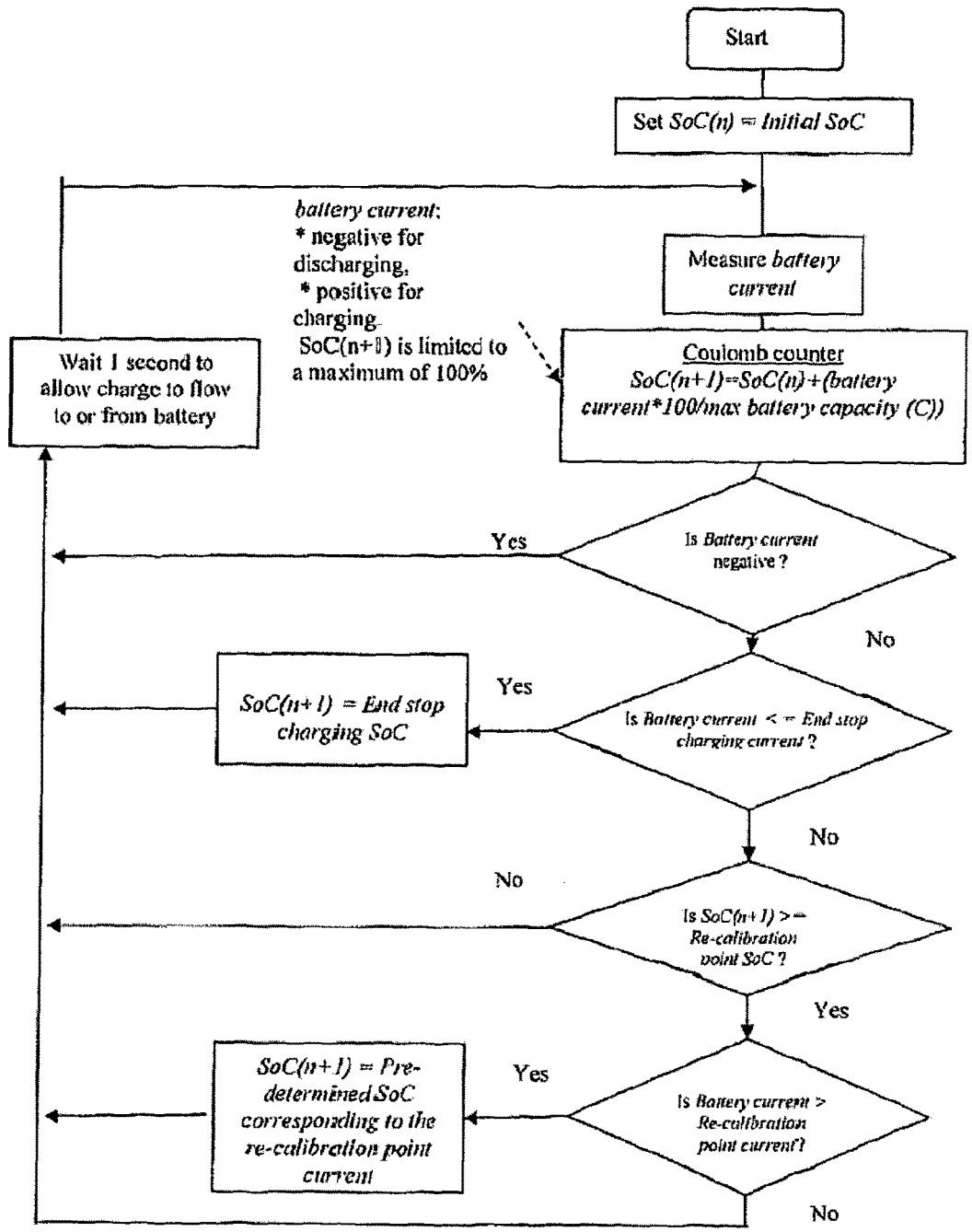
FIG. 13 shows a flow chart of a Coulomb counting based charge management algorithm in accordance with the present invention which includes the capability to correct for divergence between an estimated state of charge and an assumed actual state of charge.

FIG. 13 shows a flow chart illustrating an example of a Coulomb counting algorithm that includes features for correcting the value for the estimate of percentage state of charge in a simple power supply system consisting of a charger incorporating a diesel generator and a battery. This algorithm solves three problems. Firstly it enables the state of charge to be tracked through Coulomb counting so that actions such as switching the generator on or off can be triggered based on the state of charge estimation. Secondly it solves the problem where the initial state of charge of the battery is unknown. It does this by training an arbitrarily estimated value of SoC to a substantially accurate value of SoC. Thirdly it solves the problem that the SoC estimated by the algorithm may drift from the actual state of charge, which may occur for example due to measurement inaccuracy or due to internal discharge of the battery. The algorithm solves this third problem by correcting the estimated SoC value every time the battery approaches a re-calibration point in the curve of battery state of charge verses charging current or when the battery reaches an 'end stop' re-calibration point. The 'end stop' state of charge represents the state of charge beyond which it is inefficient to continue charging with a diesel generator, since to increase the state of charge beyond this point has a disproportionately high cost in fuel consumed relative to the benefits that would be obtained such as state of charge increase and battery longevity improvement.

When the system is initially commissioned or when a system reset is performed, such that current state of charge data is either unavailable or has been lost then the estimate for the percentage state of charge, 'SoC(n)' of the battery which is estimated by the algorithm is set to an arbitrary value 'Initial SoC', for example 90%. Then once every second the Coulomb count is updated to account for the charge that has flowed into or out of the battery during the one second period. In order to update the Coulomb count a measurement of the 'battery current' flowing into or out of the battery is made. If the current is flowing into the battery then 'battery current' takes a positive value, if the current is flowing out of the battery and the battery is discharging into the load then 'battery current' takes a negative value. Since 1 Ampere is equivalent to a charge flow of 1 Coulomb per second, the change in 'SoC' is given by 'battery current' multiplied by 100 divided by the maximum charge carrying capacity of the battery (measured in Coulombs). In addition, during each one second loop a number of checks are performed to see whether the estimated 'SoC' needs to be corrected. Any correction in the estimated 'SoC' value is performed by comparing the estimated SoC with one or more pre-selected expected SoC values. These corrections can be performed when measured charging currents reach one or more pre-selected current values: either when measured current matches the current at the re-calibration point of the curve of battery state of charge versus battery current, see FIG. 12 or when current drops to the end stop charging current. If the battery charging current drops to the 'end stop' charge current of for example 10 A then the estimate for state of charge can be corrected to the 'end stop' charging SoC. If estimated SoC is greater or equal than the 're-calibration SoC' but measured battery charging current is higher than would be expected for this state of charge then estimated SoC is temporarily capped at the 're-calibration point SoC' until the battery current comes into line with the expected current flow at the re-calibration point. Re-calibration point SoC might for example be 94% with a corresponding current of for example 30 A. End stop charge current might for example be 10 A corresponding to an end point SoC of for example 97%. One of the benefits in identifying multiple distinctive points in the curve of battery charging current vs state of charge at which corrections in the estimated state of charge can be applied is that more flexibility is provided in the selection of the upper state of charge point which is used to trigger the switching off of the generator. In this example the SoC at which the generator could be switched off might be between the re-calibration point SoC of 94% and the end stop state of charge of 97%. Note that in this case, where the triggering SoC for switching off the generator is less than the 'end stop' SoC, re-calibration of SoC to the end point SoC might only occur following initial system installation when fully charged batteries are connected to the charge controller. Hence in the period following initial system installation re-calibration would typically occur at the 're-calibration' point.

Figure 14:
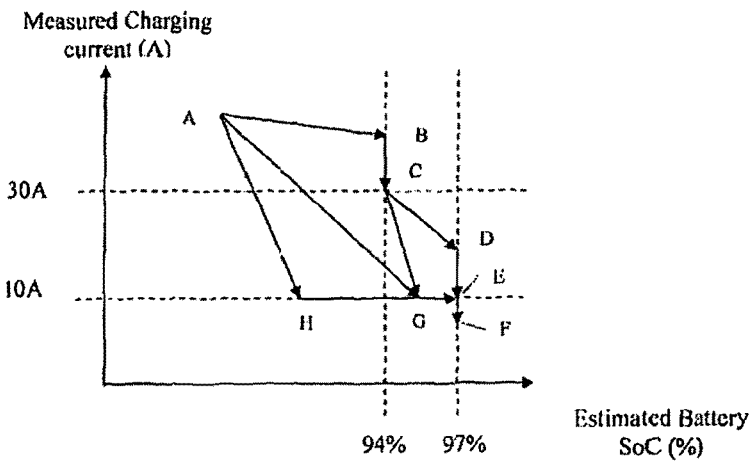
FIG. 14, FIG. 15 and FIG. 16 illustrate different trajectories that the estimate of state of charge may follow as the battery is charged, with each figure drawn for a different initial state, for the case of the charge management algorithm shown in FIG. 13.
Figure 15:
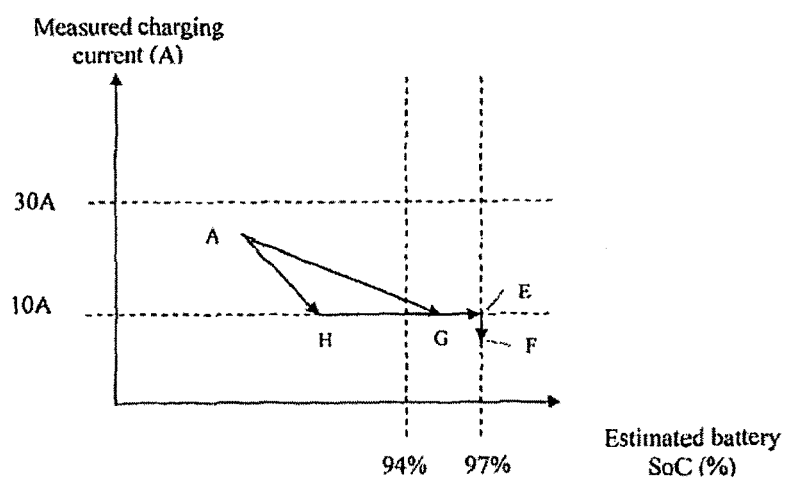
Figure 16:
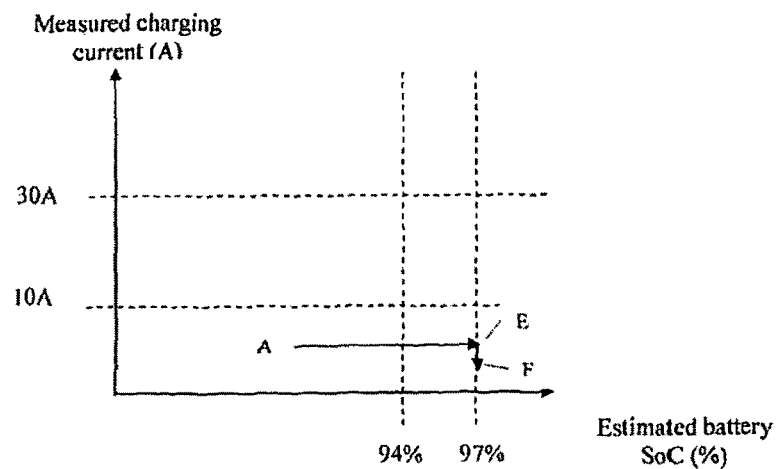

FIG. 14, FIG. 15 and FIG. 16 illustrate the different trajectories that the estimate of 'SoC' may take in the algorithm described in FIG. 13, with each figure drawn for a different initial state which is indicated by point A on all the plots. For each figure the algorithm may arrive at point A when the system is originally initialised, for example when the system is first commissioned. In the case of FIG. 14 the system might alternatively arrive at point A following a significant discharge. In the mobile radio base site power supply application a significant discharge would be expected to occur typically once per day, and state of charge might typically drop to 55% for example.

In FIG. 14 the current flowing at point A is greater than the 're-calibration point current' of 30 A and the estimated SoC is less than the re-calibration point SoC of 94%. As charge flows into the battery the estimate for SoC may move from A to B, A to G or A to H. If the estimated SoC moves from A to B then at point B the estimated SoC is held at 94% until measured charging current has reduced to the 're-calibration point current', which occurs at point C after which upward revised estimations of the SoC based on Coulomb counting can recommence. The estimate in SoC can then move from point C either to point D where the Coulomb count will cap it at 97% or can move to point G where, because the current has dropped to the 'end stop charge current', the estimated SoC is corrected to 97% which is indicated by a jump along the trajectory to point E. Once the estimated state of charge has reached either point D or E, any further reductions in the charging current result in no change to the estimated SoC which is held at 97%. Alternatively, the computation of the estimated SoC may take the trajectory A to G or A to H, where in each case once the charging current has reduced to the 'end stop charge current' of 10 A, the estimate of SoC is corrected to a value of 97%, indicated by a jump along the trajectory to point E.

In FIG. 15 the measured current flowing at point A is less than the 're-calibration point current' of 30 A but greater than the 'end stop charge current' of 10 A, whilst the estimated SoC is less than the re-calibration point SoC of 94%. As charge flows into the battery the estimate for 'SoC' may move from A to G or A to H, where in each case once the charging current has reduced to the 'end stop charge current' of 10 A, the estimate of SoC is corrected to a value of 97% shown by a jump along the trajectory to point E. If charging current continues to fall, the estimated state of charge is held at 97%, as shown by the part of the trajectory between points E and F.

In FIG. 16 the current flowing at point A is less than the 'end stop charge current' of 10 A, whilst the estimated SoC is less than the re-calibration point SoC of 94%. As Coulombs are counted the estimate for 'SoC' will jump from point A to point E as the estimated state of charge is corrected to 97%.

It may be noted, with respect to the algorithm of FIG. 13, that when a simple power supply system consisting of a generator and a battery is initially commissioned the battery charge management algorithm will not gain an accurate value for battery state of charge until the battery is approaching full charge. This is acceptable in applications where in the first charge cycle following commissioning the main purpose of the Coulomb counting algorithm will be to determine the point at which the battery approaches full charge so that the generator can be switched off. Note that the change in current and voltage regulation required as the charging moves from the bulk charging phase to the absorption charging phase can be triggered by alternative methods such as through monitoring of the battery voltage level.

Figure 17:
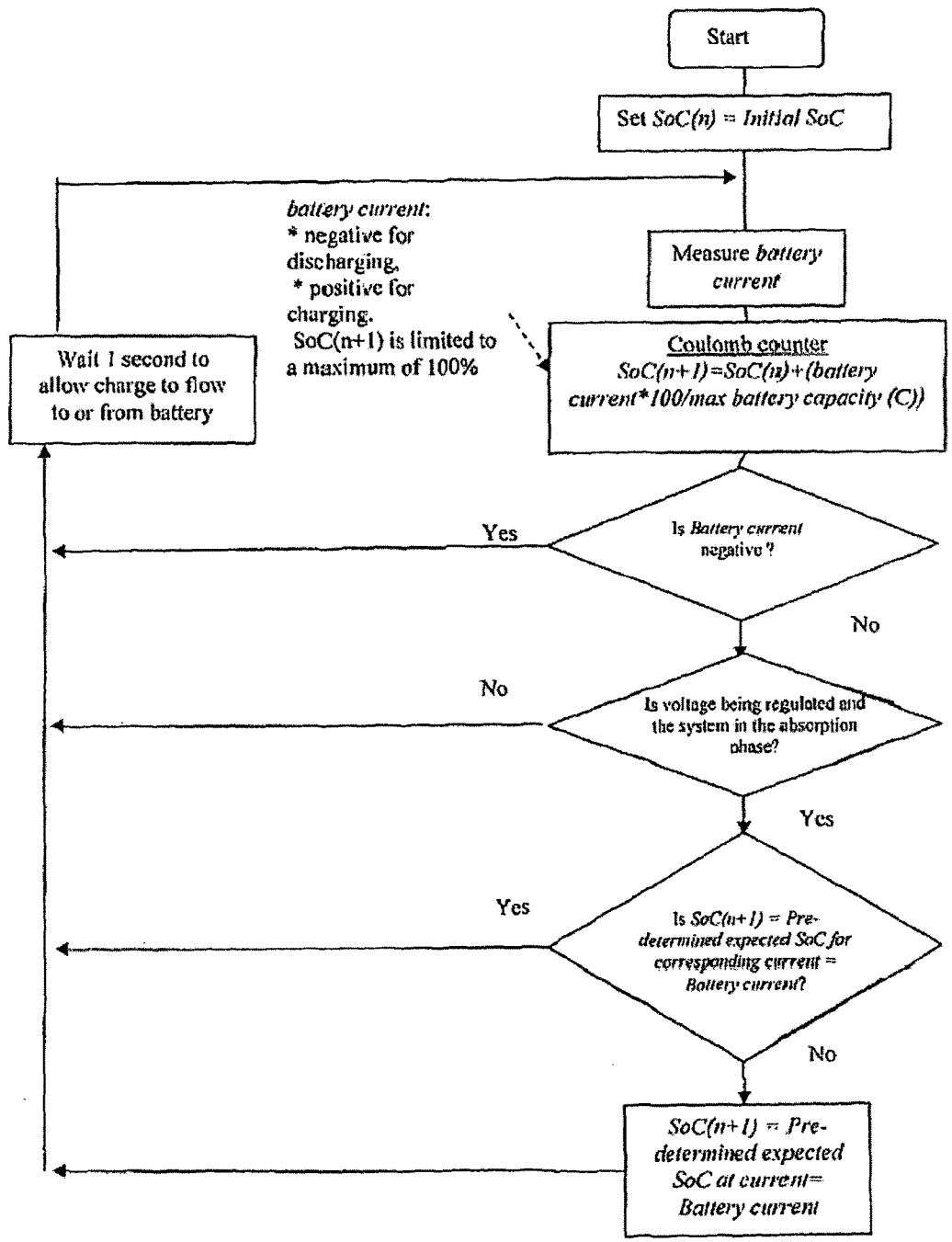
FIG. 17 shows another flow chart of a Coulomb counting based charge management algorithm in accordance with the present invention which includes the capability to correct for divergence between an estimated state of charge and an assumed actual state of charge.

FIG. 17 shows another algorithm for Coulomb counting that includes features for correcting the value for the estimate of percentage state of charge. As with the algorithm described in FIG. 13 battery current is measured every second and the Coulomb count is updated every second. If it is determined that the voltage is being regulated and the system is in the absorption phase then a check is made to see whether the measured battery current is equal to one of the current values which can be used to trigger a re-calibration of SoC. There may be multiple re-calibration current levels which could be spread throughout the current range spanned by the absorption phase, indeed in the limit re-calibration could be carried out every time a new battery current measurement is made. Where battery current equals re-calibration current a look-up of the expected SoC (the re-calibration point SoC) for this current value is determined using pre-determined mappings of charging current against SoC. If the expected SoC differs from the estimated SoC computed by the Coulomb count then the estimated SoC is corrected to be the same as the expected SoC.

Figure 18:
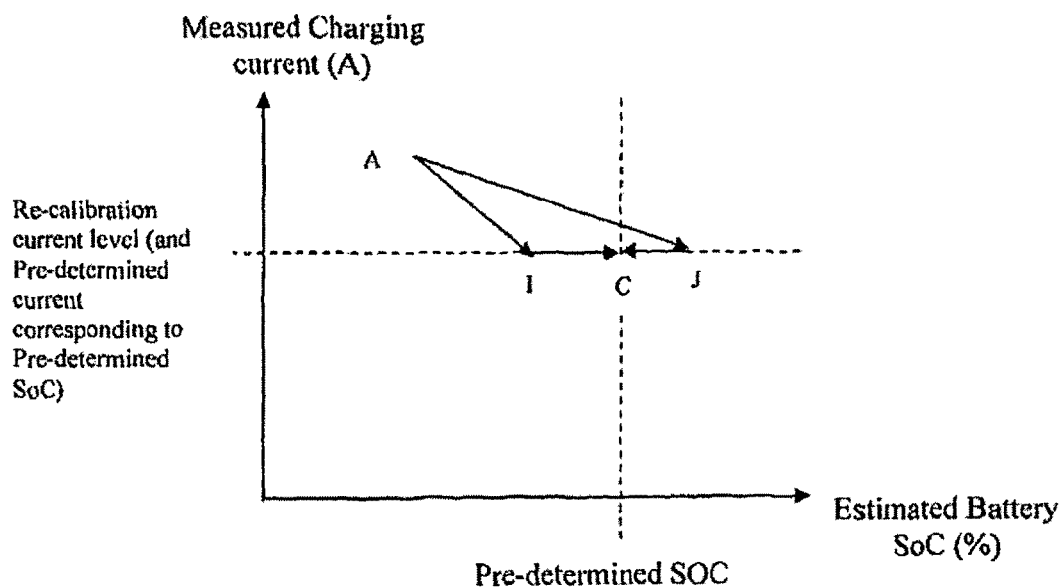
FIG. 18 illustrates different trajectories that the estimate of state of charge may follow as the battery is charged, for the case of the charge management algorithm shown in FIG. 17.

FIG. 18 shows possible trajectories in computed SoC according to the algorithm of FIG. 17. The starting point of the trajectory is point A, the system may arrive in this state, for example following a significant discharge. As charging continues, charging current drops and estimated SoC increases until the measured charging current reaches the re-calibration current level at either point I or point J. A comparison is then made between the expected SoC corresponding to the re-calibration current level with the estimated state of charge. If the estimated SoC is below the pre-determined SoC and is at point I for example then estimated SoC is increased so that it is equal to the pre-determined expected SoC. If the estimated SoC is above the pre-determined SoC and is at point J for example then estimated SoC is decreased so that it is equal to the pre-determined expected SoC.

Note that the system will only be in the absorption phase with voltage being regulated if the current that can be supplied by the energy sources is greater than the current which is being drawn by the battery. For this reason, in the absorption phase the battery charging current is determined purely by the state of charge of the battery and is not dependent on the current supply capabilities of the energy sources.

Note that for a simple system consisting of just a diesel generator based charger and a battery supplying power to a mobile radio base station there will typically be one charge and one discharge per day. The main requirement during charging is to determine when to switch off the generator. Because it is known with some certainty that the generator will be able to supply power through both bulk and absorption phases, it would be possible to determine when the generator should be switched off simply by monitoring charging current and switching off the generator when the charging current is low enough. The main requirement during discharging is to determine when to switch the generator on again. During discharge there is no current to measure and the state of charge as given by the Coulomb counter is required to determine when to switch the generator off. However for other more complex power supply configurations it is essential to keep track of battery state of charge during charging as well as discharging. An example of a more complex scenario would be one in which there is a source of power which is less reliable and less controllable than a generator, for example a scenario in which there is a renewable energy component or a grid connection which only supplies power sporadically during the day. In these scenarios there may be multiple small scale charge and discharge cycles occurring throughout the day during which the Coulomb count during both charging and discharging should be maintained. Tracking of the SoC level is needed so that the charge management algorithm can determine when and if the generator should be switched on. Since charging current may be a function of both the maximum current which can be supplied by the energy source(s) as well as the charge acceptance of the battery, where a variable output power renewable energy source is charging the battery, it won't necessarily be possible during charging to track the state of charge by monitoring charging current alone.

In one embodiment of the invention a check is performed to confirm that the current which can be supplied by the energy sources exceeds the current which is being drawn by the battery, and only when this is the case is a re-calibration based on measured charging current allowed to occur. In order to determine the maximum charging current which can be supplied by a given wind turbine configuration at any given instant a measurement of wind speed may be made. In order to determine the maximum charging current which can be supplied by a given photo-voltaic panel configuration at any given instant a measurement of solar insolation may be made.

For power supply scenarios which include only less reliable energy sources such as renewables or low availability grid connections, there are additional benefits in correcting erroneous SoC at the earliest possible opportunity, i.e. when SoC is still relatively low or equivalently when charging current is still high as will occur shortly after the system has gone into the absorption phase. This is beneficial because in such systems the point at which discharge will occur cannot be controlled, and for this reason SoC re-calibration should be carried out at the earliest possible opportunity.

There are also benefits in correcting erroneous SoC at the earliest possible opportunity in power supply scenarios which include a combination of less reliable energy sources such as renewables and a diesel generator. In such scenarios it may be desirable, for example to switch the generator off at state of charge levels well below full charge if weather forecasts indicate that there may be sufficient wind or solar energy coming. In such scenarios the battery could be charged from say 90% to 97% using renewables and without running the generator. So the generator could be switched off at 90%, thereby saving fuel. If re-calibration of SoC is achievable at a value less than 90% then re-calibration of SoC would have been achieved even if the projected wind or solar energy did not in fact materialise.

An alternative way of correcting for the possible drift between computed Coulomb count and actual Coulomb count is to periodically perform an extended run in the float phase at the end of which there can be a high level of confidence that the battery will have reached full charge after which the assumed value for state of charge can be set accordingly at 100%. However, this is more costly in energy consumption terms since charging current needs to be supplied for longer than is necessary.

The capacity of a battery will decrease over time as it ages and/or as battery cells cease to be effective. However, the battery charging algorithm requires an accurate value for maximum battery capacity (measured in Ah). This is because if the algorithm uses a value for battery capacity which is higher than what it actually is then the depth of discharge will be more than is desirable, since the Coulomb counting algorithm will allow more charge to flow out of the battery than is desirable, which will reduce battery longevity. Hence there is a need to determine the changing capacity of the battery, 'max battery capacity' as it ages and to then apply the new value in the battery charge management algorithm.

Figure 19:
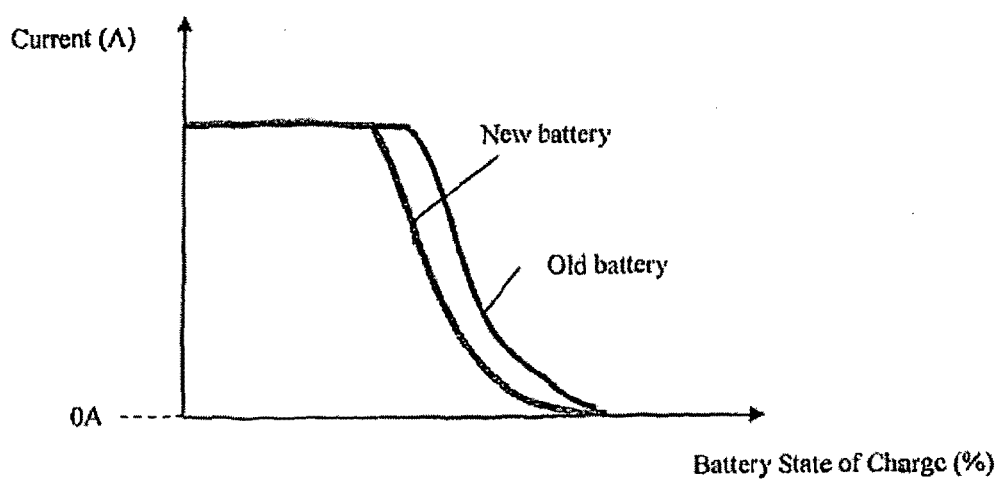
FIG. 19 shows the curve of battery current drawn versus battery state of charge for two different batteries, where each battery is of a different age.
Figure 20:
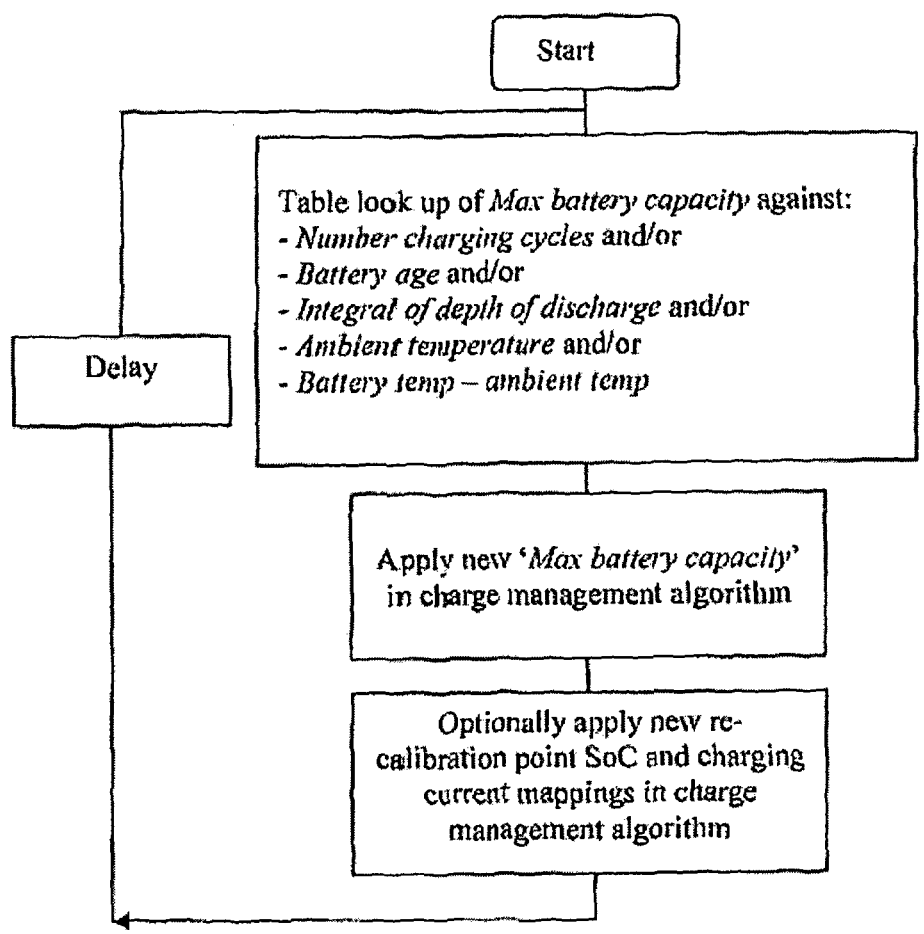
FIG. 20 illustrates a flow chart for tracking changes in battery capacity in accordance with a further aspect of the present invention and applying updates to certain of the values which are used in the charge management algorithm of FIG. 13.

FIG. 19 shows the curve of battery current drawn versus battery state of charge. For some battery types the shape of this curve will change as the battery ages or as some of the battery cells in a battery string fail. Hence in addition to modifying the value for maximum battery capacity as a battery ages or as cells fail, it may also be necessary to change other values used in the charge management algorithm such as the pre-determined mappings of expected SoC against current FIG. 20 shows an example of an algorithm which can be used to track changes in battery capacity and thence apply the corresponding updates to the pre-selected values used in the charge management algorithm. Depending on the type of battery, it may be appropriate to perform a table look-up of maximum battery capacity against one or more values. One such value is the number of battery cycles since manufacture. Another such value is the actual age of the battery as measured in terms of the number of days expired since the battery was manufactured. Another value is the integral of the depth of discharge measured over all the charge cycles since manufacture, where depth of discharge is the proportionate discharge of the battery relative to the maximum possible discharge. Another value is the ambient temperature. Another value is the difference between ambient temperature and battery temperature. The algorithm could use any or all of these parameters to perform a look-up against a pre-computed multi-dimensional table which would give a figure for the maximum battery capacity that should be assumed. Optionally, the table look-up may also be used to provide values for the pre-determined mappings of expected SoC against current. Having made an update to the values used in the charge management algorithm a re-computation of values would not be undertaken again until after some period had expired. This period is indicated as 'delay' in FIG. 20. If the algorithm were making use of ambient temperatures readings then this re-evaluation might be frequent, for example hourly. Alternatively where it is the case that only other more slowly changing factors are taken into account, such as integral of depth of discharge then the delay may take on a larger value such as one week.

Figure 21:
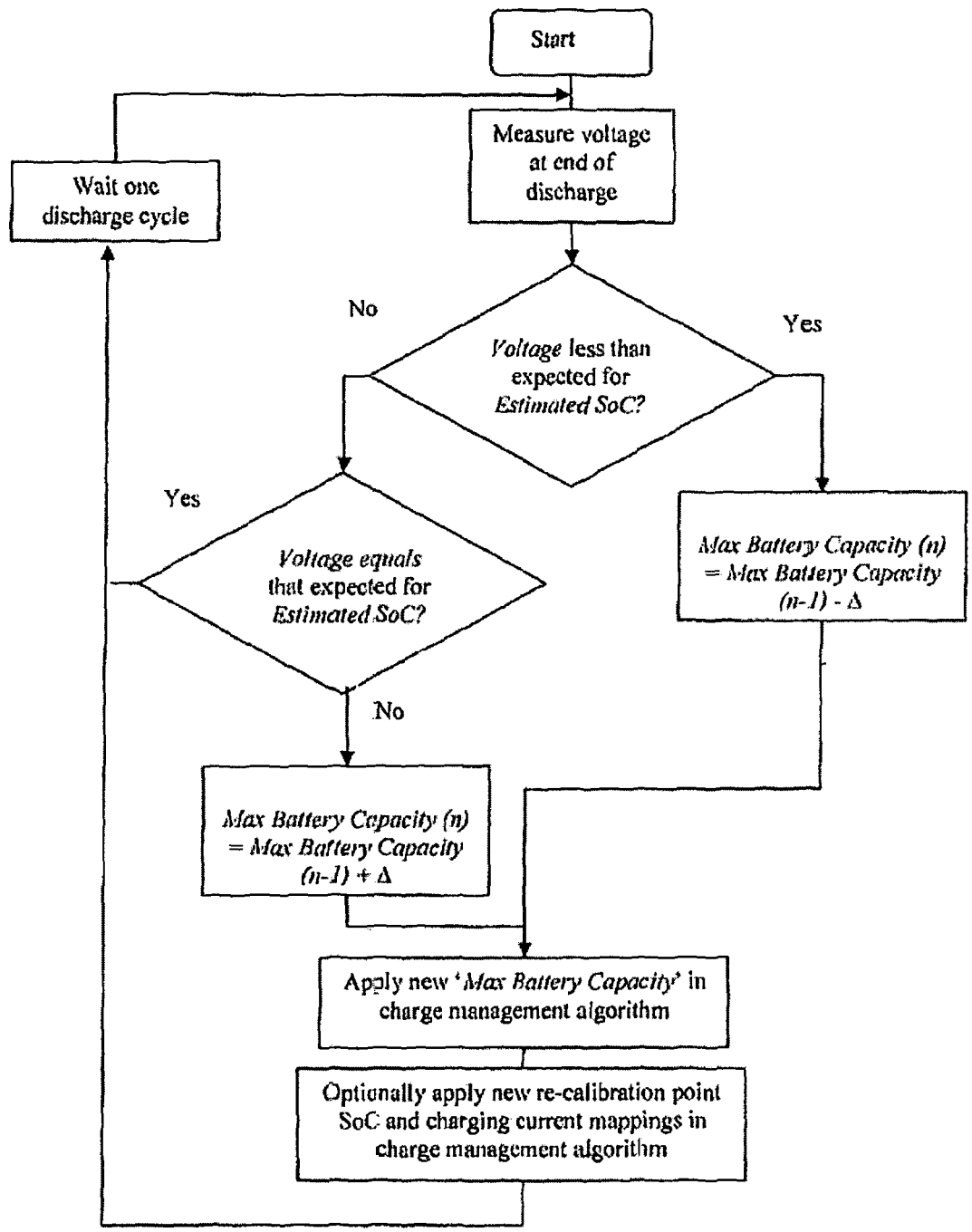
FIG. 21 illustrates another flow chart for identifying changes in battery capacity in accordance with the further aspect of the present invention and applying updates to certain of the values which are used in the charge management algorithm of FIG. 13.

FIG. 21 illustrates an alternative algorithm for identifying a difference between the battery capacity assumed by the battery charge management algorithm and the actual battery capacity by measuring the voltage level at the end of the discharge period and seeing whether it is lower or higher than that which would be expected given the computed Coulomb count. If the charge management algorithm uses a value for battery capacity which is higher than the actual level then the depth of discharge will be more than is desirable, because the Coulomb counting algorithm will have allowed more charge to flow out of the battery than is desirable. In this case the battery voltage at the end of the discharge will therefore be lower than what would be expected for the given state of charge. In the converse situation, if the algorithm uses a value for battery capacity which is lower than the actual value then the allowed depth of discharge will be limited to a lesser amount than that which would actually be acceptable. In this case the battery voltage at the end of the discharge will be higher than would be expected for the given state of charge. A correction for the case where the determined battery capacity appears to be lower than the battery capacity assumed in the charge management algorithm can be achieved by decrementing the value for maximum battery capacity used in the algorithm by a small amount in each charge cycle until the voltage level at the end of the discharge period corresponds to that which would be expected for the computed Coulomb count. A correction for the case where the determined battery capacity appears to be higher than the battery capacity assumed in the charge management algorithm can be achieved by incrementing the value for maximum battery capacity used in the algorithm by a small amount in each charge cycle until the voltage level at the end of the discharge period corresponds to that which would be expected for the computed Coulomb count. Optionally the derived value for current maximum battery capacity could also be used to perform a table look up of the pre-determined mappings of expected SoC and charging current. Re-evaluation of the charge management algorithm values would occur once every discharge cycle, which in the case of the diesel generator and battery based mobile radio base station power supply application would typically be daily. Hence in this example the 'delay' referred to in the flow chart would be one day.

Figure 22:
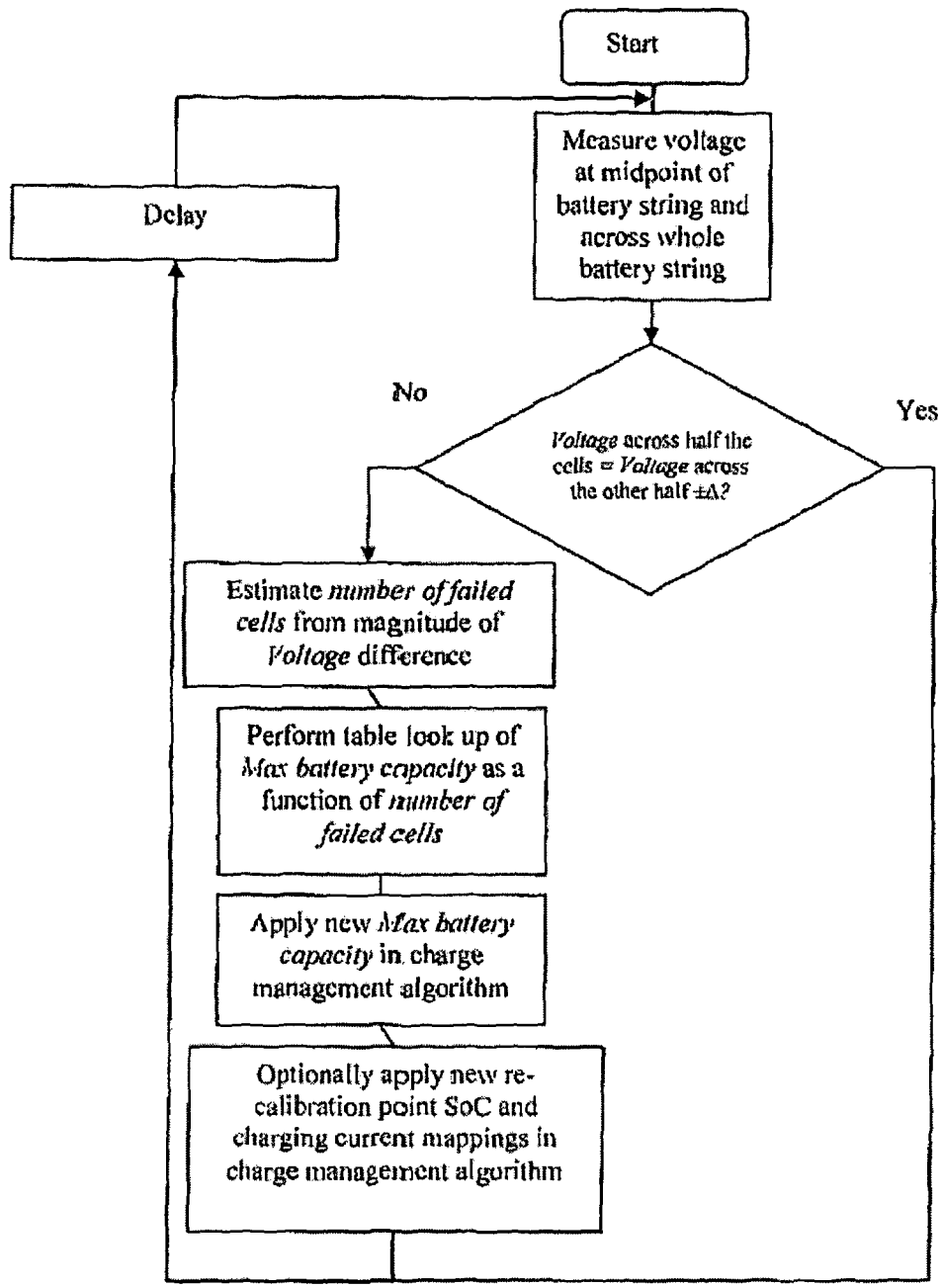
FIG. 22 illustrates a flow chart for identifying changes in battery capacity caused by battery cell failure in accordance with the further aspect of the present invention and applying the corresponding required updates to certain of the values which are used in the charge management algorithm of FIG. 13.

The curve of battery state of charge versus charging current will change in the event that a cell fails, since the string with the failed cell will become more resistive. FIG. 22 illustrates an alternative algorithm for triggering the application of new values in the battery charge management algorithm through the detection of catastrophic failure of one or more battery cells. Detection of battery cell failure can be performed by measuring voltage at the midpoint of the cells in a string of cells, such that the voltage across half the cells in a string can be compared with the voltage across the other half of cells in the string. If the two voltage measurements are not sufficiently close then this is indicative of a cell failure. The magnitude of the voltage difference can give an indication of the number of cells that have failed. It should be noted that failure is only detectable using this method when equivalent failures have not occurred on either side of the midpoint. Where a battery cell failure has occurred the pre-determined mappings of expected SoC and charging current can be obtained by performing a table look-up against the number of failed cells. Re-evaluation of the charge management algorithm values would occur fairly frequently, for example once every discharge cycle, which in the case of a diesel generator and battery based mobile radio base station power supply application would typically be daily. Hence the 'delay' referred to in the flow chart would be one day.

Changes to the apparatus and methods described in detail above are envisaged without departing from the scope of the invention as set out in the accompanying claims. In particular, in FIGS. 14, 15 and 16 although further charging of the battery between points E and F is illustrated, it is envisaged that the charging cycle may be stopped at point E and that charging along the trajectory E-F is only performed occasionally as an extended float phase charge.

Particular aspects and embodiments are described further in the following numbered paragraphs:

1. A battery charge management method comprising the steps of:
   a) determining charge delivered to or from a battery based on Coulomb counting and updating an estimated battery state of charge based on the amount of delivered charge;
   b) measuring the battery current;
   c) comparing the updated estimated battery state of charge with a predetermined state of charge value of less than 100%, each predetermined state of charge value being associated with an expected battery current for that predetermined state of charge value; and
   d) modifying the updated estimated battery state of charge either:
      i) when the updated estimated state of charge is greater than the predetermined state of charge value or equal to the predetermined state of charge and the measured battery current is greater than the expected battery current associated with the predetermined state of charge or equal to the expected battery current associated with the predetermined state of charge, or
      ii) when the estimated state of charge is not equal to the pre-determined state of charge but the measured battery current is substantially equal to the expected battery current associated with the pre-determined state of charge.

2. The battery charge management method of paragraph 1, further comprising the step of modifying the updated estimated state of charge to an end point state of charge value when the measured battery current is at least less than a predetermined current value at which further charging of the battery is halted.

3. The battery charge management method of paragraph 2, wherein the end point state of charge value is around 97%.

4. The battery charge management method of any one of paragraphs 1 to 3, wherein during charging, when the estimated battery state of charge is less than the pre-determined state of charge and the measured current is greater than the predetermined current value associated with the battery being fully charged, the updated estimated state of charge is not modified.

5. The battery charge management method of any one of paragraphs 1 to 4, wherein when the battery's initial state of charge is unknown, an initial arbitrary value for the estimated battery state of charge is selected prior to the first update of the estimated state of charge.

6. The battery charge management method of any one of paragraphs 1 to 5, wherein the step of modifying the updated estimated state of charge comprises the step of assigning the predetermined state of charge value to the updated estimated state of charge.

7a. The battery charge management method of any one of paragraphs 1 to 6, wherein charging of the battery continues after the measured battery current equals or is less than the expected battery current associated with the predetermined state of charge value.

7b. The battery charge management method of any one of paragraphs 1 to 6, wherein charging of the battery continues after the measured battery current equals or is more than the expected battery current associated with the predetermined state of charge value.

8. The battery charge management method of any one of paragraphs 1 to 7, wherein the updated estimated state of charge is compared against a plurality of predetermined state of charge values, each predetermined state of charge value having an associated expected battery current, the updated estimated state of charge being modified when the updated estimated state of charge falls between two predetermined state of charge values but at least one of the two expected battery current values either side of the measured battery current is not associated with one of the two predetermined state of charge values either side of the updated estimated battery state of charge.

9. The battery charge management method of any one of paragraphs 1 to 8, wherein the estimated battery state of charge is only modified during a charging phase in which battery voltage is regulated to the absorption voltage.

10. The battery management method of any one of paragraphs 1 to 9, wherein the estimated battery state of charge is only modified during a battery charging phase when the available current to charge the battery is greater than the current which can be drawn by the battery.

11. The battery management method of paragraph 10, wherein when the battery is charged at least in part using current supplied by a wind turbine, the available current is determined with respect to a measurement of wind speed.

12. The battery management method of paragraph 10, wherein when the battery is charge at least in part using current supplied by a photo-voltaic panel, the available current is determined with respect to a measurement of solar insolation.

13. A battery management method comprising the steps of:
   a) determining charge delivered to or from a battery using Coulomb counting wherein the maximum amount of charge that can be delivered to or from the battery is based upon an expected battery capacity;
   b) monitoring at least one characteristic of the battery representative of the battery's actual capacity; and
   c) modifying the expected battery capacity in accordance with the monitored characteristic.

14. The battery management method of paragraph 13, wherein the monitored characteristic is the number of charging cycles to which the battery has been subjected.

15. The battery management method of paragraph 13, wherein the monitored characteristic is the battery age.

16. The battery management method of paragraph 13, wherein the monitored characteristic is the integral of depth of discharge measured over all charge cycles since manufacture of the battery.

17. The battery management method of paragraph 13, wherein the monitored characteristic is the ambient temperature.

18. The battery management method of paragraph 13, wherein the monitored characteristic is the difference between the battery temperature and the ambient temperature.
19. The battery management method of paragraph 13, wherein the characteristic of the battery representative of the battery's actual capacity is monitored at a predetermined point in the charging/discharging cycle of the battery and the method further comprises the steps of:
    comparing the monitored characteristic with an expected value based on the expected battery capacity; and modifying the expected battery capacity when the comparison identifies a difference between the monitored characteristic and the expected value.
20. The battery management method of paragraph 19, wherein when the comparison indicates the actual battery capacity to be lower than the expected battery capacity, the expected battery capacity is reduced a small amount each charge cycle until substantially no difference is identified in the comparison step.
21. The battery management method of either of paragraph 19, wherein when the comparison indicates the actual battery capacity to be higher than the expected battery capacity, the expected battery capacity is increased by a small amount each charge cycle until substantially no difference is identified in the comparison step.
22. The battery management method of any one of paragraphs 19 to 21, wherein the monitored battery characteristic is the voltage level of the battery at the end of a discharge period.
23. The battery management method of any one of paragraphs 19 to 21, wherein the monitored battery characteristic is the battery charging current at a selected state of charge.
24. The battery management method of paragraph 13, wherein the battery comprises a string of battery cells and the expected battery capacity is modified when it is determined that one or more battery cells have ceased to function.
25. The battery management method of paragraph 24, further comprising the step of comparing the voltage measured across half the cells in the battery string with the voltage measured across the other half of the battery cells in the battery string and determining whether one or more battery cells have ceased to function on the basis of a difference between the measured voltages.
26. The battery management method of paragraph 24, wherein the number of failed battery cells is estimated according to the magnitude of the difference between the two measured voltages.
27. The battery management method of any one of paragraphs 24 to 26, wherein when it is determined a modification of the expected battery capacity is required, the expected battery capacity is modified by an amount determined with respect to a look-up table of battery capacity versus number of failed cells.
28. The battery management method of any one of paragraphs 13 to 27 in combination with the battery charge management method of any one of paragraphs 1 to 12.
29. The battery management method of paragraph 28, wherein the predetermined state of charge value and/or the predetermined battery current corresponding to the predetermined state of charge value is changed when the expected battery capacity is modified.

30. A battery charge management device comprising:
    means for measuring the battery current;
    a Coulomb counter for determining charge delivered to or from a battery based on Coulomb counting and for updating an estimated battery state of charge based on the amount of delivered charge;
    memory means in which is stored a predetermined state of charge value of less than 100% and an expected battery current associated with the predetermined state of charge;
    an analyser for comparing the updated estimated battery state of charge with the predetermined state of charge value and for modifying the updated estimated battery state of charge either:
    a) when the updated estimated state of charge is greater than the predetermined state of charge value or equal to the predetermined state of charge value and the measured battery current is greater than the expected battery current associated with the predetermined state of charge or equal to the expected battery current associated with the predetermined state of charge, or
    b) when the estimated state of charge is not equal to the pre-determined state of charge but the measured battery current is substantially equal to the expected battery current associated with the predetermined state of charge.
31. A battery management device comprising:
    a Coulomb counter for determining charge delivered to or from a battery using Coulomb counting wherein the maximum amount of charge that can be delivered to or from the battery is based upon an expected battery capacity
    a controller for monitoring at least one characteristic of the battery representative of the battery's actual capacity; and for modifying the expected battery capacity in accordance with the monitored characteristic.
32. The battery management device of paragraph 31, further comprising a temperature monitor for monitoring one or both of ambient temperature and battery temperature.
33. The battery management device of paragraph 31, wherein the controller is adapted to monitor the at least one characteristic of the battery at a predetermined point in the charging/discharging cycle of the battery and is adapted to compare the monitored characteristic with an expected value based on the expected battery capacity and to modify the expected battery capacity when the comparison identifies a difference between the monitored characteristic and the expected value.

It will be appreciated that the present invention is applicable to, but not limited to, the charging of lead acid batteries.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The functions of the various elements shown in the Figures, including any functional blocks labelled as "processors" or "logic", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" or "logic" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the Figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

What is claimed:
1. A battery state of charge management method comprising the steps of:
   estimating a battery state of charge;
   determining charge delivered to or from a battery based on Coulomb counting and updating said estimated battery state of charge based on the amount of delivered charge;
   measuring the battery current and comparing the updated estimated battery state of charge with a selected recalibration point state of charge having a value of less than 100%, the selected recalibration point state of charge having a value being associated with an expected battery current for that selected recalibration point state of charge value; and
   modifying the updated estimated battery state of charge when the updated estimated state of charge is greater than the selected recalibration point state of charge value and the measured battery current is greater than the expected battery current associated with the selected recalibration point state of charge.

2. The battery charge management method of claim 1, further comprising the step of modifying the updated estimated state of charge to 100% when the measured battery current is less than a predetermined current value associated with the battery being fully charged.

3. The battery charge management method of claim 1, wherein during charging, when the estimated battery state of charge is less than the selected recalibration point state of charge and the measured current is greater than the predetermined current value associated with the battery being fully charged, the updated estimated state of charge is not modified.

4. The battery charge management method of claim 1, wherein a selected recalibration point state of charge value is determined at or near a point of greater than average change in the differential of battery state of charge expressed as a function of battery charging current.

5. The battery charge management method of claim 1, wherein when a battery's initial state of charge is unknown, an initial arbitrary value for the estimated battery state of charge is selected prior to the first update of the estimated state of charge.

6. The battery charge management method of claim 4, wherein the step of modifying the updated estimated state of charge comprises the step of assigning the selected recalibration point state of charge value to the updated estimated state of charge.

7. The battery charge management method of claim 1, wherein charging of the battery continues after the measured battery current equals or is less than the expected battery current associated with the selected recalibration point state of charge value.

8. The battery charge management method of claim 1, wherein the updated estimated state of charge is compared against a plurality of selected recalibration point state of charge values, each selected recalibration point state of charge value having an associated expect battery current, the updated estimated state of charge being modified when the updated estimated state of charge falls between two selected recalibration point state of charge values but at least one of the two expected battery current values either side of the measured battery current is not associated with one of the two selected recalibration point state of charge values either side of the updated estimated battery state of charge.

9. The battery charge management method of claim 1, further comprising:
   monitoring at least one characteristic of the battery representative of the battery's actual capacity; and
   modifying the expected battery capacity used in determining charge delivered to or from the battery with respect to the monitored characteristic, wherein the monitored characteristic is the integral of depth of discharge measured over all charge cycles since manufacture of the battery.

10. The battery charge management method of claim 1, further comprising:
   monitoring at least one characteristic of the battery representative of the battery's actual capacity; and
   modifying the expected battery capacity used in determining charge delivered to or from the battery with respect to the monitored characteristic, wherein the characteristic of the battery representative of the battery's actual capacity is monitored at a predetermined point in the charging/discharging cycle of the battery; and comparing the monitored characteristic with an expected value based on the expected battery capacity; and modifying the expected battery capacity when the comparison identifies a difference between the monitored characteristic and the expected value.

11. The battery charge management method of claim 10, wherein when the comparison indicates the actual battery capacity to be lower than the expected battery capacity, the expected battery capacity is reduced a small amount each charge cycle until substantially no difference is identified in the comparison step.

12. The battery charge management method of claim 10, wherein the monitored battery characteristic is the battery charging current at a selected state of charge and wherein a curve of battery charging current with respect to battery state of charge is compared with a set of pre-determined mappings.

13. The battery charge management method of claim 1, wherein the battery comprises a string of battery cells and the expected battery capacity is modified when it is determined that one or more battery cells have ceased to function.

14. The battery charge management method of claim 13, wherein when it is determined a modification of the expected battery capacity is required, the expected battery capacity is modified by an amount determined with respect to a look-up table of battery capacity versus number of failed cells.

15. A battery state of charge management device comprising:
- means for measuring the battery current;
- a Coulomb counter for determining charge delivered to or from a battery based on Coulomb counting and for updating an estimated battery state of charge based on the amount of delivered charge;
- memory means in which is stored a selected recalibration point state of charge value of less than 100% and an expected battery current for that selected recalibration point state of charge; and
- an analyzer for comparing the updated estimated battery state of charge with the selected recalibration point state of charge value and for modifying the updated estimated battery state of charge when the updated estimated state of charge is greater than the selected recalibration point state of charge value and the measured battery current is greater than the expected battery current associated with the selected recalibration point state of charge.

\* \* \* \* \*